(12) United States Patent
Chen et al.

(10) Patent No.: US 12,291,777 B2
(45) Date of Patent: May 6, 2025

(54) THROUGHPUT IMPROVEMENT WITH INTERVAL CONDITIONING PURGING

(71) Applicant: Lam Research Corporation, Fremont, CA (US)

(72) Inventors: Chun-Hao Chen, Portland, OR (US); Jeremy David Fields, Portland, OR (US); Frank Loren Pasquale, Tigard, OR (US)

(73) Assignee: Lam Research Corporation, Fremont, CA (US)

( * ) Notice: Subject to any disclaimer, the term of this patent is extended or adjusted under 35 U.S.C. 154(b) by 707 days.

(21) Appl. No.: 17/309,211

(22) PCT Filed: Nov. 27, 2019

(86) PCT No.: PCT/US2019/063479
§ 371 (c)(1),
(2) Date: May 7, 2021

(87) PCT Pub. No.: WO2020/112923
PCT Pub. Date: Jun. 4, 2020

(65) Prior Publication Data
US 2021/0395885 A1    Dec. 23, 2021

Related U.S. Application Data

(60) Provisional application No. 62/773,998, filed on Nov. 30, 2018.

(51) Int. Cl.
*C23C 16/44*    (2006.01)
*C23C 16/455*   (2006.01)
(Continued)

(52) U.S. Cl.
CPC .... *C23C 16/4408* (2013.01); *C23C 16/45557* (2013.01); *C23C 16/505* (2013.01);
(Continued)

(58) Field of Classification Search
CPC .......... C23C 16/4408; C23C 16/45557; C23C 16/505; C23C 16/45536
See application file for complete search history.

(56) References Cited

U.S. PATENT DOCUMENTS 5,516,367 A * 5/1996 Lei .......................... C23C 16/46
                                                    118/728
6,565,791 B1 * 5/2003 Laurent ............. H01J 37/32192
                                                    264/129

(Continued)

FOREIGN PATENT DOCUMENTS

CN    102376564 A    3/2012
CN    103938179 A    7/2014
(Continued)

OTHER PUBLICATIONS

Fujimoto, Hiroshi, et al., "Influence of vacuum chamber impurities on the lifetime of organic light-emitting diodes". Scientific Reports | 6:38482 | Dec. 2016, pp. 1-9.*

(Continued)

*Primary Examiner* — Bret P Chen
(74) *Attorney, Agent, or Firm* — Weaver Austin Villeneuve & Sampson LLP

(57) ABSTRACT

Processing methods and apparatus for increasing a reaction chamber batch size. Such a method of processing deposition substrates (e.g., wafers), involves conducting a deposition on a first portion of a batch of deposition wafers in a reaction chamber, conducting an interval conditioning reaction chamber purge to remove defects generated by the wafer processing from the reaction chamber; and following the interval conditioning mid-batch reaction chamber purge, conducting the deposition on another portion of the batch of wafers in the reaction chamber. The interval conditioning reaction chamber purge is conducted prior to exceeding a baseline for acceptable defect (e.g., particle) generation in (Continued)

the chamber and is performed while no wafers are positioned in the reaction chamber.

19 Claims, 11 Drawing Sheets

(51) Int. Cl.
*C23C 16/505* (2006.01)
*H01J 37/32* (2006.01)

(52) U.S. Cl.
CPC .. *H01J 37/32174* (2013.01); *H01J 37/32449* (2013.01); *H01J 37/32834* (2013.01); *H01J 37/32862* (2013.01); *H01J 37/32935* (2013.01); *C23C 16/45536* (2013.01); *C23C 16/45544* (2013.01); *H01J 2237/3321* (2013.01)

(56) References Cited

U.S. PATENT DOCUMENTS

| | | | |
|---|---|---|---|
| 7,138,967 B2 * | 11/2006 | Kimura | G09G 5/399 345/82 |
| 7,727,906 B1 | 6/2010 | Shanker et al. | |
| 8,012,859 B1 * | 9/2011 | Joe | C23C 16/24 438/503 |
| 8,524,612 B2 | 9/2013 | Li et al. | |
| 8,728,956 B2 | 5/2014 | LaVoie et al. | |
| 9,355,839 B2 | 5/2016 | Swaminathan et al. | |
| 9,828,672 B2 | 11/2017 | Varadarajan et al. | |
| 10,431,451 B2 | 10/2019 | Agarwal et al. | |
| 2002/0088543 A1 * | 7/2002 | Ashjaee | H01L 21/67173 156/345.31 |
| 2003/0190804 A1 * | 10/2003 | Glenn | C23C 16/45527 257/E21.171 |
| 2004/0037973 A1 | 2/2004 | Li et al. | |
| 2005/0264802 A1 * | 12/2005 | Shibata | H01L 21/67028 356/237.5 |
| 2006/0060303 A1 | 3/2006 | Fink et al. | |
| 2008/0044567 A1 | 2/2008 | Seo et al. | |
| 2008/0050884 A1 * | 2/2008 | Koyanagi | H01L 21/3142 438/785 |
| 2008/0075858 A1 * | 3/2008 | Koh | C23C 16/403 118/704 |
| 2008/0216746 A1 | 9/2008 | Fujita et al. | |
| 2009/0017637 A1 * | 1/2009 | Huang | C23C 16/4412 438/758 |
| 2009/0041925 A1 * | 2/2009 | Lewis | C23C 16/4405 118/699 |
| 2010/0062614 A1 | 3/2010 | Ma et al. | |
| 2011/0237051 A1 * | 9/2011 | Hess | H01J 37/3244 118/725 |
| 2011/0256734 A1 | 10/2011 | Hausmann et al. | |
| 2012/0040536 A1 | 2/2012 | Furuta et al. | |
| 2013/0192524 A1 * | 8/2013 | Wu | H01L 21/67346 414/806 |
| 2013/0196078 A1 * | 8/2013 | Yudovsky | C23C 16/4584 427/535 |
| 2013/0247937 A1 | 9/2013 | Nunomura et al. | |
| 2013/0252434 A1 | 9/2013 | Yuasa et al. | |
| 2014/0113439 A1 | 4/2014 | Patel et al. | |
| 2014/0134332 A1 * | 5/2014 | Sugino | C23C 16/45591 427/248.1 |
| 2015/0203967 A1 | 7/2015 | Dhas et al. | |
| 2015/0287740 A1 | 10/2015 | Bedell et al. | |
| 2015/0340225 A1 | 11/2015 | Kim et al. | |
| 2015/0354059 A1 | 12/2015 | Kang et al. | |
| 2016/0056032 A1 | 2/2016 | Baldasseroni et al. | |
| 2016/0090650 A1 | 3/2016 | Qian et al. | |
| 2016/0099156 A1 * | 4/2016 | Yamaguchi | B24B 53/017 438/692 |
| 2016/0281230 A1 | 9/2016 | Varadarajan et al. | |
| 2017/0029947 A1 | 2/2017 | Kawahara et al. | |
| 2017/0029948 A1 | 2/2017 | Jongbloed et al. | |
| 2017/0133202 A1 | 5/2017 | Berry, III | |
| 2017/0207069 A1 | 7/2017 | Bhatia et al. | |
| 2018/0374697 A1 | 12/2018 | Agarwal et al. | |

FOREIGN PATENT DOCUMENTS

| | | | | |
|---|---|---|---|---|
| CN | 105463408 A | 4/2016 | | |
| JP | 2010206050 A | 9/2010 | | |
| JP | 2013214726 A | 10/2013 | | |
| JP | 2014086730 A | 5/2014 | | |
| JP | 2015025146 A | 2/2015 | | |
| JP | 2016122778 A | 7/2016 | | |
| KR | 20020049881 A | 6/2002 | | |
| KR | 20040047303 A | 6/2004 | | |
| KR | 20050093187 A | 9/2005 | | |
| KR | 20150086197 A | 7/2015 | | |
| KR | 20150125614 A | 11/2015 | | |
| KR | 20160038783 A | 4/2016 | | |
| KR | 20170031239 A | 3/2017 | | |
| KR | 20170059211 A | 5/2017 | | |
| TW | 201546314 A | 12/2015 | | |
| TW | 201619429 A | 6/2016 | | |
| WO | WO 2013/164583 | * | 11/2012 | ............. B01J 38/10 |
| WO | WO-2017062087 A1 | 4/2017 | | |

OTHER PUBLICATIONS

Final Office Action dated Apr. 4, 2019 issued in U.S. Appl. No. 15/799,679.
International Preliminary Report on Patentability dated Jun. 10, 2021 issued in Application No. PCT/US2019/063479.
International Preliminary Report on Patentability dated May 14, 2020 issued in Application No. PCT/US2018/058164.
International Search Report and Written Opinion dated Feb. 22, 2019 issued in Application No. PCT/US2018/058164.
International Search Report and Written Opinion dated Mar. 20, 2020 issued in Application No. PCT/US2019/063479.
Notice of Allowance dated May 22, 2019 issued in U.S. Appl. No. 15/799,679.
Office Action dated Dec. 18, 2018 issued in U.S. Appl. No. 15/799,679.
Office Action dated Jun. 28, 2018 issued in U.S. Appl. No. 15/799,679.
Puurunen, Riikka L. (2005) "Surface chemistry of atomic layer deposition: A case study for the trimethylaluminum/water process," Journal of Applied Physics, 97:121301-1-121301-52.
Singapore Search Report and Written Opinion dated Aug. 3, 2021 issued in Application No. SG 11202003372R.
TW Office Action dated May 25, 2022, in Application No. TW107138329 with English translation.
TW Office Action dated May 25, 2022, in Application No. TW107138329.
CN Office Action dated Mar. 10, 2023, in Application No. CN201980078817.1 with English translation.
CN Office Action dated Oct. 21, 2022, in Application No. CN201980078817.1 with English translation.
JP Office Action dated Nov. 15, 2022, in Application No. JP2020-522906 with English translation.
KR Office Action dated Oct. 19, 2023 in Application No. KR10-2020-7015569 with English Translation.
TW Office Action dated Jul. 14, 2023, in application No. TW108143327 with English translation.
JP Office Action dated Jan. 9, 2024 in JP Application No. 20210529278, with English Translation.
TW Office Action dated Apr. 16, 2024 in TW Application No. 108143327, with English Translation .
CN Office Action dated Jun. 26, 2024 in CN Application No. 201880070970.5 with English translation.
JP Office Action dated Jul. 30, 2024 in JP Application No. 2021-529278 with English translation.
KR Office Action dated Jul. 15, 2024 in KR Application No. 10-2021-7019616 with English translation.

(56) References Cited

OTHER PUBLICATIONS

TW Office Action dated Sep. 30, 2024 in TW Application No. 108143327 with English translation.

* cited by examiner

| Parameters | | Interval Purge Conditions |
|---|---|---|
| Gas Flow (slm) | SHD Gas | 0-60 |
| | Chamber Gas | 0-60 |
| Pressure | Torr | 0.05-6 |
| Time | Min | 0.5-30 |

FIG. 5

THROUGHPUT IMPROVEMENT WITH INTERVAL CONDITIONING PURGING

INCORPORATION BY REFERENCE

An Application Data Sheet is filed concurrently with this specification as part of the present application. Each application that the present application claims benefit of or priority to as identified in the concurrently filed Application Data Sheet is incorporated by reference herein in their entireties and for all purposes.

BACKGROUND

Semiconductor processing typically takes place in specialized processing apparatus where optimizing for efficient throughput is often desirable. Such apparatus may include a reaction chamber that houses various pieces of hardware (e.g., a substrate support piece, showerhead, etc.) used in processing a batch of wafers during semiconductor fabrication. In some cases, the total number of wafers able to be processed by the reaction chamber between chamber cleans, sometimes referred to as a batch size, may be limited due to the accumulation of defects on various internal components of the reaction chamber and/or upstream apparatus components, requiring that the processing be stopped and the chamber shut down for cleaning.

SUMMARY

Described herein are processing methods and apparatus for increasing a reaction chamber batch size.

In some embodiments, a method of processing deposition substrates in a processing apparatus may be provided. The method may include conducting a deposition on a first portion of a batch of deposition wafers in a reaction chamber, conducting an interval conditioning reaction chamber purge to remove defects generated by the wafer processing from the reaction chamber before an accumulation baseline is reached, and following the interval conditioning reaction chamber purge, conducting the deposition on another portion of the batch of deposition wafers in the reaction chamber.

In some embodiments, the method may further include removing, after conducting the deposition on the first portion of the batch of deposition wafers in the reaction chamber, the wafers from the reaction chamber. No wafers may be inside the reaction chamber during the interval conditioning reaction chamber purge.

In some embodiments, the conducting the interval conditioning reaction chamber purge may be performed based on a total accumulation of deposited material during the first portion of the batch.

In some such embodiments, the conducting the interval conditioning reaction chamber purge may be performed when the total accumulation of deposited material in the reaction chamber has reached an accumulation threshold, and the accumulation threshold may be less than the accumulation baseline.

In some further such embodiments, the method may further include determining whether the total accumulation of deposited material in the reaction chamber has reached the accumulation threshold. The conducting the interval conditioning reaction chamber purge may be performed in response to determining that the total accumulation of deposited material in the reaction chamber has reached the accumulation threshold.

In some such embodiments, the total accumulation of deposited material in the reaction chamber may be based on a count of wafers processed in the first portion of the batch.

In some embodiments, the conducting the interval conditioning reaction chamber purge may be performed based on a count of wafers processed in the reaction chamber in the first portion of the batch of wafers.

In some such embodiments, the first portion of the batch of wafers may include a number of wafers, the conducting the interval conditioning reaction chamber purge may be performed when the count of the wafers processed during the first portion of the batch of wafers has reached the number of wafers, the accumulation baseline may be reached when a second count of wafers have been processed in the reaction chamber, and the count may be less than the second count.

In some further such embodiments, the method may further include determining whether the count of wafers processed during the first portion of the batch of wafers has reached the number of wafers. The conducting the interval conditioning reaction chamber purge maybe performed in response to determining that the count of wafers processed during the first portion of the batch of wafers has reached the number of wafers.

In some embodiments, the method may further include conducting, after conducting the deposition of the other portion of the batch of deposition wafers, a second interval conditioning reaction chamber purge to remove defects generated by the wafer processing from the reaction chamber before an accumulation baseline is reached, and following the second interval conditioning reaction chamber purge, conducting the deposition on a third portion of the batch of deposition wafers in the reaction chamber.

In some embodiments, the accumulation baseline may be based on a count of substrates in the first portion of the batch.

In some embodiments, the accumulation baseline may be based on a total accumulation of deposited material during the first portion of the batch.

In some embodiments, the method may further include cleaning the interior surfaces of the reaction chamber following the accumulation baseline being reached.

In some embodiments, the method may further include removing, after conducting the deposition of the first portion of the batch of deposition substrates in the reaction chamber, the wafers from the reaction chamber. No wafers may be inside the reaction chamber during the interval conditioning reaction chamber purge.

In some embodiments, the conducting the interval conditioning reaction chamber purge may include flowing purge gas through one or more components of a gas delivery system fluidically connected to the reaction chamber.

In some such embodiments, the components of the gas delivery system may include one or more of a showerhead, a collar, gas line, a valves, a manifold, a ceramic tee, and/or a remote plasma control module.

In some embodiments, the conducting the interval conditioning reaction chamber purge may include flowing purge gas into the reaction chamber at two or more flowrates.

In some embodiments, the conducting the interval conditioning reaction chamber purge may include flowing purge gas into the reaction chamber at a constant flowrate.

In some embodiments, the conducting the interval conditioning reaction chamber purge may include flowing purge gas into the reaction chamber for at least 1 minute.

In some embodiments, the method may further include applying, during at least a part of the interval conditioning reaction chamber purge, an RF power to the reaction chamber to generate a plasma within the reaction chamber.

In some such embodiments, a power of the applied RF may be reduced during the application of the RF power to the reaction chamber.

In some such further embodiments, a pressure of the reaction chamber may be reduced during the application of the RF power to the reaction chamber.

In some embodiments, a plasma processing apparatus for processing a substrate may be provided. The apparatus may include a reaction chamber that includes interior chamber surfaces, a substrate support for supporting a substrate within the reaction chamber, and a showerhead and one or more inlets for providing plasma and/or process gases to the chamber, and an exhaust port for removing material from the reaction chamber. The apparatus may also include a gas delivery system fluidically connected to the one or more inlets, and a controller configured to execute instructions for conducting a deposition on a first portion of a batch of deposition wafers in a reaction chamber, causing the gas delivery system to conduct an interval conditioning reaction chamber purge to remove defects generated by the wafer processing from the reaction chamber before an accumulation baseline is reached, and following the interval conditioning reaction chamber purge, conducting the deposition on another portion of the batch of deposition wafers in the reaction chamber.

In some embodiments, the controller may be further configured to execute instructions for causing the cleaning of the interior surfaces of the reaction chamber following the accumulation baseline being reached.

In some embodiments, the apparatus may further include a robot configured to remove deposition substrates from the reaction chamber, and the controller may be further configured to execute instructions for causing the robot to remove the deposition substrates from the reaction chamber prior to conducting the mid-batch reach chamber purge.

In some embodiments, causing the gas delivery system to conduct the interval conditioning reaction chamber purge may further causes purge gas to flow through one or more components of the gas delivery system, and the components of the gas delivery system include one or more of a showerhead, a collar, gas line, a valves, a manifold, a ceramic tee, and/or a remote plasma control module.

In some embodiments, a method of processing deposition substrates (e.g., wafers) may involve conducting a deposition on a first portion of a batch of deposition substrates in reaction chamber, conducting an interval conditioning reaction chamber purge to remove defects generated by the wafer processing from the reaction chamber and/or components of the processing apparatus upstream of the reaction chamber, such as the gas lines, valves, etc.; and following the interval conditioning reaction chamber purge, conducting the deposition on another portion of the batch of deposition substrates in the reaction chamber. The interval conditioning reaction chamber purge is conducted prior to exceeding a baseline for acceptable defect (e.g., particle) generation in the chamber.

According to various embodiments, the interval conditioning reaction chamber purge may be triggered by, for example, a wafer count or an accumulated deposition thickness empirically determined to be correlated with a baseline acceptable maximum level of defects. The purge is generally a flow of inert gas (e.g., Ar) through the chamber and or system at a suitable pressure and for a suitable time to remove generated defects (e.g., particles). Suitable examples are described further below.

As noted above, according to various embodiments, the purge may alternatively or additionally extend from the chamber to components of the processing apparatus upstream of the reaction chamber, such as the gas lines, valves, etc.

According to various embodiments, the deposition/purge cycles may be repeated throughout the batch until the maximum accumulation limit is reached.

According to various embodiments, periodic (also referred to herein as interval or mid-batch) purging of a processing apparatus, for example an Atomic Layer Deposition (ALD) tool, such as the Striker Oxide tool available from Lam Research Corporation, Fremont, CA, can improve defect performance even as accumulation builds. It can also allow for an increase in maximum accumulation without exceeding a baseline acceptable maximum level of defect generation before a full chamber and/or apparatus clean is required. So, the approach can improve defect performance while extending the accumulation limit, which increases the throughput of a wafer processing apparatus and associated processing system.

In various embodiments, the approach may be implemented without additional hardware, and with a controller programmed to monitor processing, including particle measurement on monitor wafers, and trigger purging after a set number of wafers or after a fixed accumulation limit.

In a particular embodiment, wafers are processed until an accumulation limit is reached, the accumulation limit determined experimentally based on unit film properties and when they start to drift. Defects, e.g., particle generation from off-target material deposition in the apparatus, are often the main issue with regard to drifting film properties at higher accumulation. An interval (mid-batch) conditioning purge is conducted based on wafer count or accumulation, for example. The purge purges the chamber surfaces, showerhead and upstream apparatus components before an out of control (OOC) event is observed. This interval conditioning purging increases the maximum accumulation limit, and thus there is an increase in throughput.

Another aspect involves a plasma processing apparatus for processing a substrate. The apparatus may further include a reaction chamber comprising: interior chamber surfaces, a substrate support for supporting a substrate within the reaction chamber, a showerhead and one or more inlets for providing plasma and/or process gases to the chamber, and one or more exhaust ports for removing material from the reaction chamber; and a controller programmed to execute instructions for: conducting a deposition on a first portion of a batch of deposition substrates in reaction chamber, conducting an interval conditioning reaction chamber purge to remove defects generated by the wafer processing from the reaction chamber and/or components of the processing apparatus upstream of the reaction chamber, such as the gas lines, valves, etc.; and following the interval conditioning reaction chamber purge, conducting the deposition on another portion of the batch of deposition substrates in the reaction chamber. The interval conditioning reaction chamber purge is conducted prior to exceeding a baseline for acceptable defect (e.g., particle) generation in the chamber.

In some embodiments, the controller is further programmed to execute instructions for cleaning the interior surfaces of the reaction chamber following the desired wafer processing or the maximum accumulation limit being reached.

These and other aspects are described further below with reference to the drawings.

BRIEF DESCRIPTION OF THE DRAWINGS

FIG. 5 is an exemplary table presenting sample operational conditions for interval conditioning purge methods and apparatus in accordance with disclosed embodiments.

DETAILED DESCRIPTION

Figure 1:
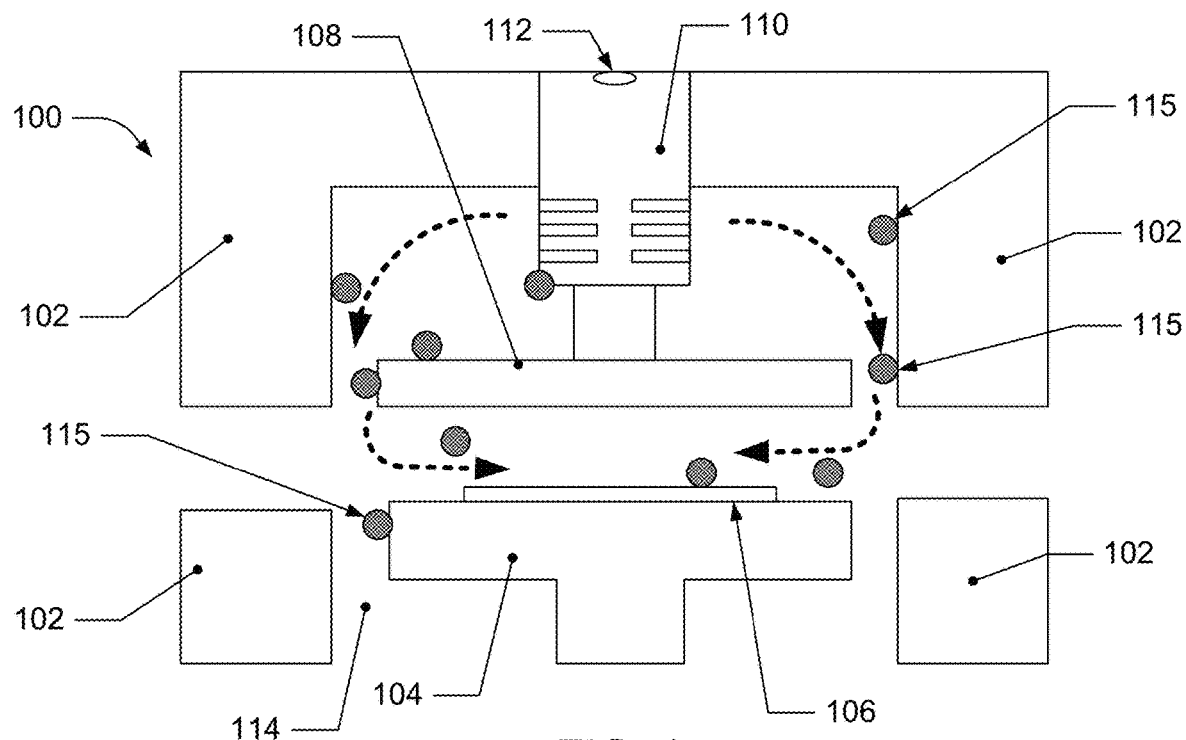
FIG. 1 illustrates a simplified view of a reaction chamber or an apparatus for processing a substrate in accordance with disclosed embodiments.

In the following description, numerous specific details are set forth to provide a thorough understanding of the presented embodiments. Embodiments disclosed herein may be practiced without some or all of these specific details. In other instances, well-known process operations have not been described in detail to not unnecessarily obscure the disclosed embodiments. Further, while the disclosed embodiments will be described in conjunction with specific embodiments, it will be understood that the specific embodiments are not intended to limit the disclosed embodiments.

In this application, the terms "wafer" and "substrate" are used interchangeably. A wafer or substrate used in the semiconductor device industry typically has a diameter of 200 mm, or 300 mm, or 450 mm. Unless otherwise stated, the processing details recited herein (e.g., flow rates, power levels, etc.) are relevant for processing 300 mm diameter substrates, or for treating chambers that are configured to process 300 mm diameter substrates, and can be scaled as appropriate for substrates or chambers of other sizes. The chambers described herein may be used to process work pieces that may be of various shapes, sizes, and materials. In addition to semiconductor wafers, other work pieces that may be processed in chambers prepared according to certain embodiments include various articles such as printed circuit boards, magnetic recording media, magnetic recording sensors, mirrors, optical elements, micro-mechanical devices and the like.

Introduction and Context

Attaining efficient reaction chamber productivity (also referred to as high throughput) is desirable in semiconductor fabrication. Batches of wafers are traditionally supplied to a reaction chamber for processing, e.g., deposition, on the wafer(s) therein. However, inadvertent off-target deposition of materials onto various interior chamber surfaces, e.g., sidewalls of the reaction chamber, showerhead, and/or components of the processing apparatus upstream of the reaction chamber, such as the gas lines, manifolds, valves, etc., may contribute to the eventual defects, e.g., particle generation, for example by flaking of such materials onto wafers being processed in the chamber. Such flaking of off-target materials is undesirable as it may contaminate wafers being processed, thereby degrading the overall quality of the processed batch of wafers. The inadvertent off-target deposition of materials onto various interior chamber surfaces is referred to herein as "accumulation." As multiple substrates are processed within the same chamber in between cleanings of that chamber, the accumulation increases as more substrates are processed. For some ALD processes, the accumulation increases substantially linearly (e.g., within 10% of linear), or non-linearly (e.g., a polynomial representation such as a $3^{rd}$ degree polynomial including: $y=x^3*\beta_3+x^2*\beta_2+x*\beta_1+\beta_0$, with x as the accumulation and y as the measured thickness of a substrate processed in the chamber). Accordingly, when the accumulation reaches such a thickness, which may be referred to as the accumulation limit, the processing of substrates is stopped and the chamber is cleaned.

Traditionally, conducting a complete clean of the reaction chamber interior was required upon reaching a reaction chamber batch size, the maximum number of wafers able to be processed in a reaction chamber prior to substantial likelihood of contamination of a wafer being processed by defects, e.g., particle generation, from accumulated off-target deposition in the chamber and/or other apparatus components. Conducting such a clean requires the reaction chamber to be vacated of contents held therein for processing, thus potentially reducing throughput and preventing the processing of a larger batch of wafers within a specified time.

Increasing the reaction chamber batch size should increase process and apparatus productivity (throughput) by allowing additional wafers to be processed within the reaction chamber between required clean cycles. Such an increase may be accomplished by conducting an interval (conditioning purge, which may also referred to herein as a mid-batch reaction chamber purge, as described herein. The phrase "mid-batch" used herein does not necessarily mean in the middle of the batch of wafers; instead, it means at one or more points after processing of the batch of substrates has begun and before processing the batch of wafers is finished, e.g., before the accumulation limit has been reached.

FIG. 1 presents a simplified exemplary view of a reaction or processing chamber in connection with which processes and apparatus in accordance with the present disclosure may be implemented. A reaction chamber 100 includes chamber walls 102. Positioned within the processing chamber 100 is a substrate support 104, on which the substrate 106, e.g., a partially-fabricated semiconductor wafer, is held for processing. The processing chamber also includes a showerhead 108 and collar 110, and one or more inlets 112 for process gases and/or plasma, and one or more exhaust outlets 114. In some embodiments, a direct and/or remote plasma source (not shown) is provided in or upstream of the processing chamber. The plasma sources include plasma generator components (e.g., coils, electrodes, etc.) for producing a plasma, which may be an inductively coupled plasma (ICP), a capacitively coupled plasma (CCP), or a microwave generated plasma, etc. Also shown in FIG. 1 are shaded circles 115 which represent deposition material and this Figure illustrates that such deposition material 115 may accumulate on surfaces of the processing chamber 100, such as on the chamber walls 102, showerhead, 108, collar 110, and substrate support 104; as described herein, this deposition material on the inside of the reaction chamber and not on the substrate 106 may be considered chamber accumulation. Once the accumulation limit is reached, this deposition material 115 may flake off and be transmitted within the reaction chamber and onto the substrate 106 which may adversely affect the substrate by causing substrate defects.

Figure 2:
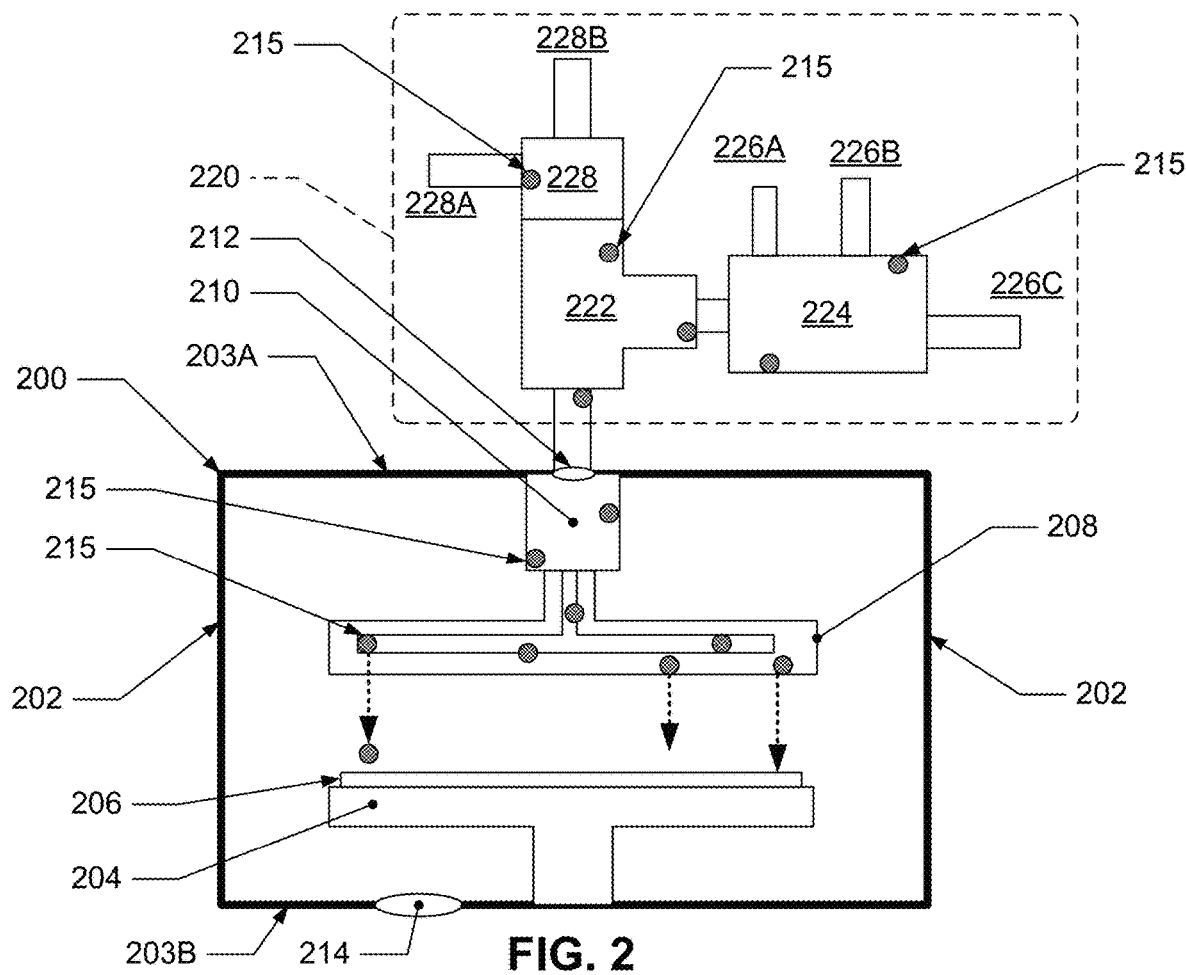
FIG. 2 illustrates a simplified view of components upstream of a reaction chamber of an apparatus for processing substrates, such as semiconductor wafers, in accordance with disclosed embodiments.

FIG. 2 illustrates a simplified exemplary view of components upstream of a reaction chamber of an apparatus. The reaction chamber 200 includes side walls 202, a top 203A, and a bottom 203B, an exhaust port 214 in the bottom 203B, a showerhead 208, a collar 210, a substrate support 204, and a substrate 206 positioned on the substrate support 204. A gas delivery system 220 of the apparatus is encompassed by the dashed rectangle and is fluidically connected to the reaction chamber 200, including the showerhead 208 and the collar 210, via one or more inlets, such as a first inlet 212. The reaction chamber 200 may be considered a plasma-enhanced atomic layer deposition (PEALD) reactor, for processing substrates, such as semiconductor wafers, in accordance with disclosed embodiments. The gas delivery system 220 includes multiple components, including, but not limited to, the showerhead collar 210, a ceramic tee (CT) 222 fluidically connected to the showerhead 208 and/or the collar 210, an optional gas conduit fluidically connecting the CT 222 to the first inlet 212, a manifold 224 fluidically connected to the CT 222, fluid lines 226A, 226B, and 226C fluidically connected to the manifold 224 for processing, a remote plasma clean (RPC) module 228 fluidically connected to the CT 222, and fluid lines 228A and 228B fluidically connected to the RPC module for gas introduction. The gas delivery system may also include other components not such, such as various piping, tubing, valves, manifolds, flow control elements (e.g., a mass flow controller).

The fluid lines 226A, 226B, and 226C may be fluidically connected to various flow elements, such as gas sources which may include precursors, reactants, and the like, as well as a divert line that fluidically connects to an exhaust or divert away from the reaction chamber. Similarly, fluid lines 228A and 228B may be connected to gas sources, such as a clean gas or remote plasma source. Over the course of processing the batch of wafers, deposited material and other contaminants may develop within the gas delivery system 220. This material may develop where different gases mix, such as junction points and manifolds, such as internal surfaces of the showerhead 208, the collar 210, the CT 222, the manifold 224, the RPC module 228, and fluid conduits connected to these components. This unwanted deposited material is represented by shaded circles 215. These contaminants may eventually be caused to flow downstream to the substrate 206 as illustrated by the arrows in FIG. 2 which is unwanted because it can contaminate the substrate 206 and result in undesirable substrate defects. As discussed below, in some embodiments it is advantageous to perform the interval conditioning reaction chamber purge to these gas delivery components.

Processing of a substrate, e.g., a semiconductor wafer, may involve deposition thereon by a variety of processes, such as Atomic Layer Deposition (ALD). During wafer processing, specified quantities of wafers, e.g. one, two or four wafers, may be processed within the processing chamber then later cycled out to allow for the entrance of new unprocessed wafers. After a certain amount of time spent processing quantities of wafers, material intended for deposition on the wafers may begin to accumulate on unintended locations, such as on the chamber walls and other chamber and/or upstream components, as depicted by the presence of particles (defects) shown in and on the chamber and upstream components in FIGS. 1 and 2. Eventually, such off-target deposited materials may begin to generate particles, e.g., flake and fall, or otherwise move, from the chamber walls onto the substrate to contaminate wafer processing, and causing unit film properties to drift.

Under typical circumstances, a collection of wafers, e.g. one or more, such as one, two, or four wafers, are processed at a time in a processing chamber, e.g., a deposition is performed on the wafers within the processing chamber. For example, in a multi-station tool such as are available from Lam Research Corporation, four wafers may enter into processing chamber, be processed, and then removed. Next, four additional unprocessed wafers may be delivered into the processing chamber for processing. Such transport and processing of collections of wafers until a total target quantity or "batch" between required chamber cleans is reached may be referred to as "batch processing." Wafers may be serially processed, one or more at a time as described above, until a maximum reaction chamber batch size, for example determined by a maximum allowable total deposition accumulation limit or wafer count correlated with such, is reached. Accordingly, in some embodiments, each batch includes a plurality of substrates that may have anywhere from a few substrates to several hundred substrates.

A "batch" of wafers refers to the total number of wafers that can be processed in the reaction chamber between reaction chamber clean cycles, before the reactor needs to be shut down for full cleaning in order to continue processing wafers without risk of process drift and/or wafer contamination from particle generation such as flaking of accumulated off-target material deposition on internal reactor components, particularly sidewalls, due to processing of the wafers within the reaction chamber. Accordingly, a "batch" of wafers refers the number of substrates that may be processed for a particular ALD process before or when the accumulation limit is reached. For example, an ALD process in a particular chamber may have an accumulation limit of 20,000 Å which is the point at which the accumulation on the chamber causes adverse effects on substrates processed in that chamber, i.e., the accumulation limit, and a batch of substrates processed in that chamber is limited to the number of substrates that may be processed before the accumulation limit of 20,000 Å is reached. In certain embodiments, the first wafer in a batch is the first wafer processed after a chamber clean. In multi-station reactors, multiple wafers are processed together, so the first wafer may be part of a group of wafers that are collectively the first wafers processed in a batch. The last wafer is the last wafer processed before a chamber clean. In multi-station reactors there will be multiple last wafers.

The present disclosure provides an alternative approach of interval or mid-batch purging in order to remove defects (e.g., particles generated in the chamber or upstream components) to allow wafer processing to continue before a maximum level of accumulation/wafer count that can be tolerated is reached and the chamber must be cleaned before processing can continue. In this way, batch sizes are increased, accumulation limits are extended, and throughput is enhanced.

Example Embodiments

In some embodiments, an interval conditioning (or mid-batch) reaction chamber purge is a purge of the reaction chamber and/or components of a gas delivery system fluidically connected to the reaction chamber during the processing of a batch of wafers while no wafers are inside the reaction chamber. As noted above, a batch of substrates refers to the number of substrates that may be processed for a particular deposition process before or when the accumulation limit is reached. This interval conditioning reaction chamber purge is therefore performed during the processing of a batch of wafers by occurring after a portion of the batch of wafers has been processed and before the accumulation limit is reached and the chamber is to be cleaned; after this interval conditioning reaction chamber purge is executed, another portion of the same batch of wafers is processed. For example, a batch of wafers may have 500 wafers and after 200 wafers of this batch have been processed (e.g. loaded into the reaction chamber, processed by depositing the desired amount of material on the wafers, and then unloaded from the reaction chamber), the interval conditioning reaction chamber purge may be performed while no wafers are in the reaction chamber, and after this interval conditioning reaction chamber purge, the remaining 300 wafers in the batch may be processed. In some instances, more than one interval conditioning reaction chamber purge may be performed during the processing of a batch of wafers.

In addition or alternatively, the interval conditioning reaction chamber purge may include the purge of various elements of the gas delivery system fluidically connected to the reaction chamber, such as a showerhead, gas lines, manifolds, and valves.

Figure 3A:
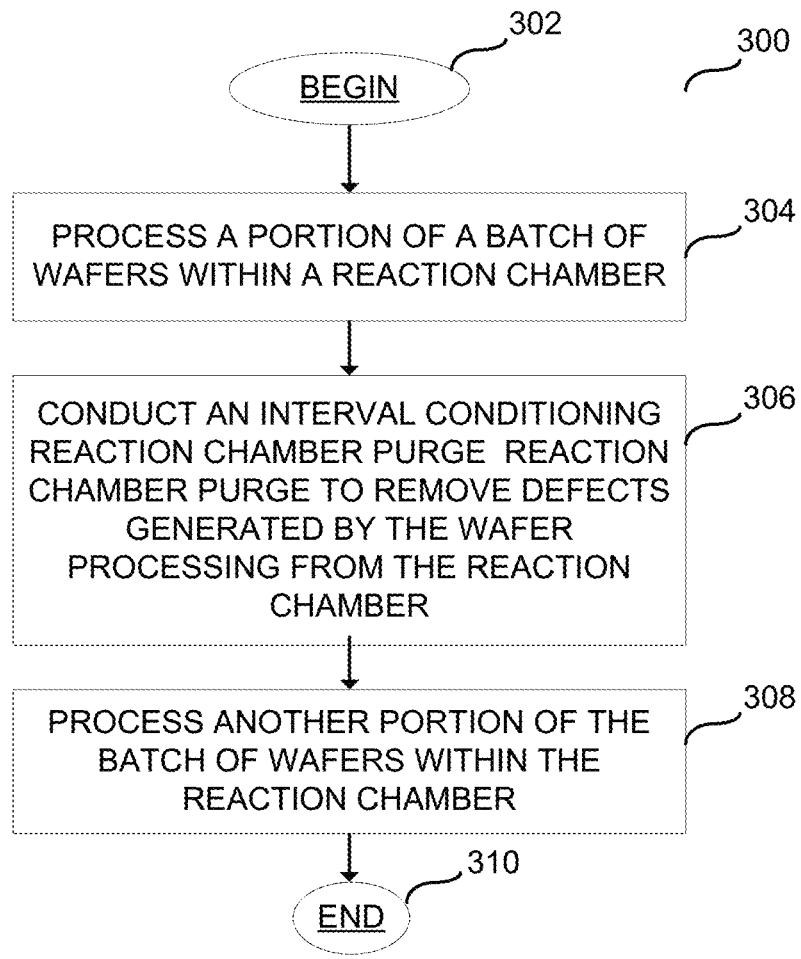
FIG. 3A is an example process flow diagram depicting operations for a method in accordance with disclosed embodiments.

FIG. 3A shows a general process flow 300 for conducting an interval (mid-batch) conditioning chamber purge during processing of a batch of semiconductor wafers. Process 300 begins at operation 302, which involves providing one or more wafers to a reaction chamber at 304, such as the process chamber illustrated in FIG. 1.

In some embodiments, multiple wafers may be entered into the reaction chamber for multi-station sequential processing and later removed from the reaction chamber upon completion of processing. In other embodiments, the chamber may be configured for processing one wafer at a time. As noted above, processing of multiple wafers may be collectively referred to as "batch processing," wherein a "batch" of wafers refers to the total number of wafers that can be processed in the reaction chamber between reaction chamber clean cycles, before the reactor needs to be shut down for full cleaning in order to continue processing wafers without risk of process drift and/or wafer contamination from particle generation such as flaking of accumulated off-target material deposition on internal reactor components, particularly sidewalls, due to processing of the wafers within the reaction chamber. Generally, a clean cycle involves a complete deactivation of the reaction chamber to accommodate a full cleaning prior to continuing processing of wafers without risk of contamination from particle generation, for example, flaking of accumulated off-target material deposited on internal reactor components, particularly sidewalls, due to prior processing of wafers within the reaction chamber. In some instances, the first wafer (for single station chambers) or wafers (for multi-station chambers) processed in the reaction chamber may be considered the first substrates processed after the chamber is cleaned.

The processing of a portion of the batch of wafers in operation 304 includes the processing of a number of wafers that is less than the total number of wafers in the batch. In the example above, the 200 wafers may be the portion of wafers processed before operation 306 is performed. In some such embodiments, for a single station reaction chamber, operation 304 includes the repeated loading of one wafer into the reaction chamber, the processing of that one wafer such as the deposition of one or more layers of material onto that wafer, the removal of that one wafer from the reaction chamber, and the loading of another wafer. In some embodiments, for a multi-station reaction chamber, operation 304 may include loading two or more wafers into the reaction chamber, the processing of those two or more wafers, the removal of one or more of those two or more wafers from the reaction chamber, and the loading of one or more additional wafers into the reaction chamber.

Under typical batch processing procedures, desired process throughput may be limited due to the ongoing accumulation of off-target materials on interior surfaces of the reaction chamber during processing of the batch of wafers. Operation 306, conducted after initial processing of a portion of the batch of wafers, addresses off-target deposition by conducting an interval conditioning (mid-batch) purge of the reaction chamber to remove defects (e.g., generated particles). According to various embodiments, the interval conditioning reaction chamber purge may be triggered by, for example, a wafer count or an accumulated deposition thickness empirically determined to be correlated with a baseline acceptable maximum level of defects. Any wafers within the reaction chamber are removed from the reaction chamber prior to initiation of the interval conditioning reaction chamber purge at operation 306 to avoid unwanted contamination from the interval conditioning purge operations. Wafers are therefore not positioned in the reaction chamber during any of the interval conditioning reaction chamber purge; accordingly, this interval conditioning reaction chamber purge is not performed during an ALD deposition cycle or between ALD deposition cycles of the same substrate. After completion of the interval conditioning reaction chamber purge at operation 306, another portion of the batch of wafers may be processed within the reaction chamber at operation 308 prior to ending process 300 at operation 310. In the example above, the other portion of the batch of wafers is the remaining 300 wafers that is processed after both the processing of the 200 wafers and the interval conditioning reaction chamber purge.

Figure 3B:
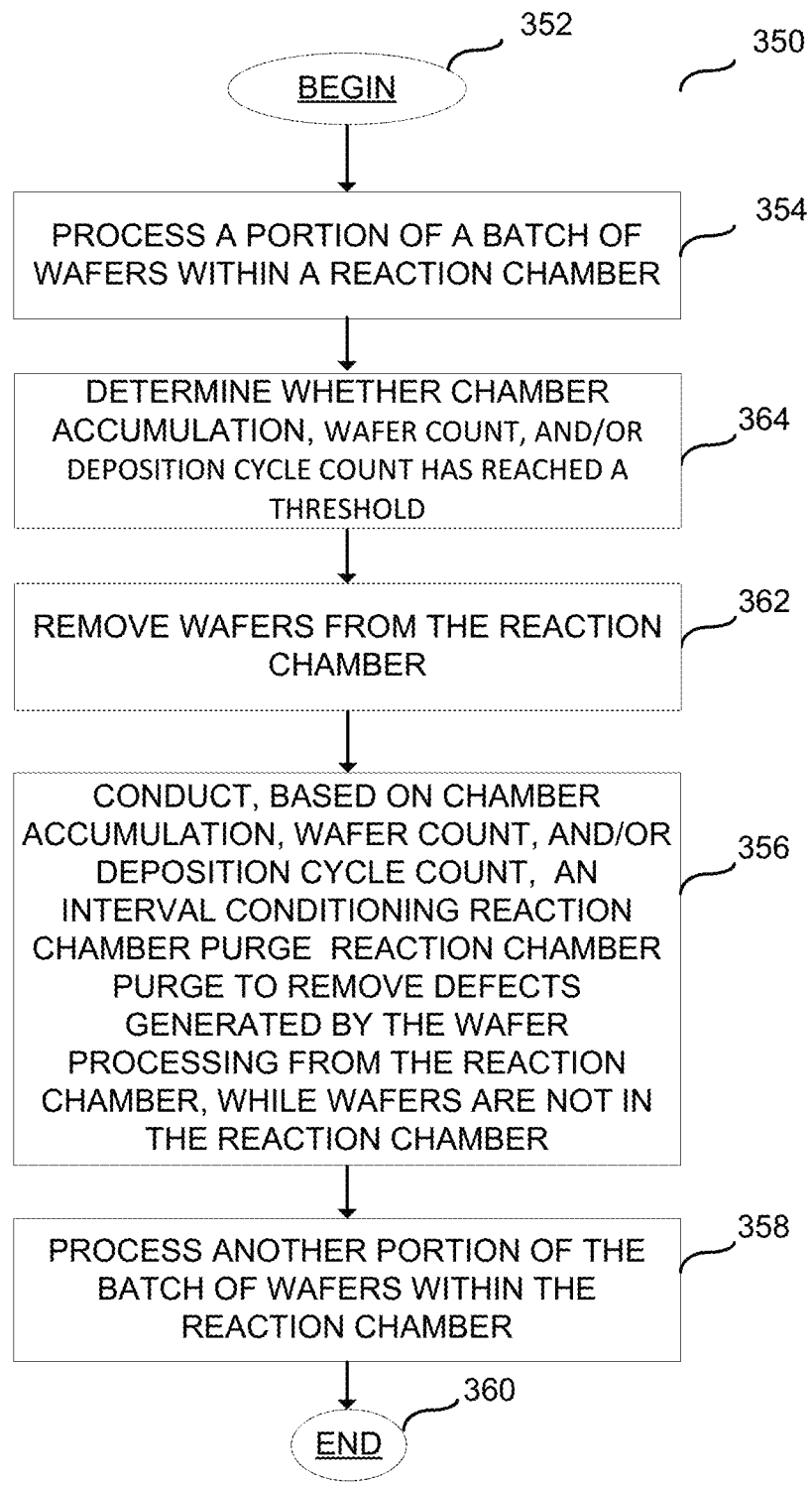
FIG. 3B is another example process flow diagram depicting operations for a method in accordance with disclosed embodiments.

FIG. 3B shows a sample embodiment process flow 350 for conducting an interval conditioning reaction chamber purge during processing of a batch of semiconductor wafers. Process 350 includes the same operations as process 300 of FIG. 3A, including operations 302, 304, 308, and 310 which are operations 352, 354, 358, and 360, respectively, in process 350, except this process 350 also includes a modified operation 306, now operation 356, and new operations 364, discussed below, and 362. Operation 362 provides for the removal of the wafers from the reaction chamber as mentioned above; during the entire interval conditioning reaction chamber purge of operation 356, wafers are not positioned in the reaction chamber. Again, this removal before and during the interval conditioning reaction chamber purge is advantageous because it prevents the unwanted wafer contamination from the interval conditioning purge operation. Modified operation 356 specifies that wafers are not in the reaction chamber during the interval conditioning reaction chamber purge.

As provided above, initiation and the performance of the interval conditioning reaction chamber purge may be based on the chamber accumulation, a wafer count, and/or a deposition cycle count reaching a particular threshold.

Operation 356 reflects this connection by specifying that the interval conditioning reaction chamber purge is performed based on the chamber accumulation, a wafer count, and/or a deposition cycle count. For example, the interval conditioning reaction chamber purge may be performed once a particular number of wafers, i.e., the wafer count, has been processed in the batch, when a particular total number of deposition cycles, i.e., the cycle count, has been performed in the reaction chamber, and/or when the amount of chamber accumulation has reached a particular amount that is less than the accumulation limit. These thresholds are less than the numbers that result in reaching an accumulation limit that results in a chamber clean, such as less than the wafer count and cycle count that results in the accumulation limit.

In some embodiments, a determination is made as to whether the chamber accumulation, wafer count, and/or deposition cycle count has reached that particular threshold, and the interval conditioning reaction chamber purge may be performed based on that determination. For instance, a determination may be made whether the chamber accumulation, wafer count, and/or deposition cycle count has reached a particular threshold, and if it is determined that the particular threshold has been reached, then the interval conditioning reaction chamber purge may be performed. In another instance, the first portion of the batch of wafers may have N wafers, and the batch of wafers has Y wafers, with Y greater than N. Once the number of wafers processed in the reaction chamber has reached a wafer count of the N wafers, the wafer count threshold may be considered reached which triggers the performance of the interval conditioning reaction chamber purge. The accumulation baseline (e.g., when a cleaning operation is to be performed) is reached when the wafer count reaches Y. The determination step may be an optional operation 364 in process 350 of FIG. 3B.

Although not included in operation 356 of FIG. 3B, the performance of the interval conditioning reaction chamber purge may be based on the determination that the chamber accumulation, wafer count, and/or deposition cycle count has reached the particular threshold or thresholds. For instance, the interval conditioning reaction chamber purge may be performed in response to determining that the total accumulation of deposited material in the reaction chamber has reached the accumulation threshold; additionally, the conducting the interval conditioning reaction chamber purge may be performed in response to determining that the count of wafers processed during the first portion of the batch of wafers has reached a wafer count threshold (e.g., the wafer count N in the above example). In some instances, the determination of the chamber accumulation may be based, at least in part, on the deposition rate of each deposition performed in the reaction chamber. Different deposition processes may have different deposition rates which in turn may change the amount of accumulation and rate of accumulation build up throughout processing the batch of wafers.

In some embodiments, more than one interval conditioning reaction chamber purge may be performed during the processing of a batch of wafers. For instance, a first interval conditioning reaction chamber purge may be performed after a first portion of wafers is processed in the batch, followed by the processing of a second portion of wafers, followed by a second interval conditioning reaction chamber purge, and finally followed by the processing of a third portion of wafers after which the accumulation baseline, or limit, is reached and a chamber clean operation is performed. It may be advantageous to perform multiple interval conditioning reaction chamber purges during a single batch of wafers because this may further delay the need to perform a chamber clean operation. In some embodiments, the multiple interval conditioning reaction chamber purges are performed in the same manners, e.g., at the same flowrates and for the same durations, while in other embodiments, depending on the deposition parameters, it may be advantageous to perform the interval conditioning reaction chamber purges under different conditions. For instance, the amount of chamber accumulation increases over the course of processing the batch of substrates and the later-performed interval conditioning reaction chamber purge or purges may be more advantageous if they are performed for longer durations and/or higher flowrates than previous ones in order to remove more chamber accumulation and/or unwanted deposition in the gas delivery system.

The interval conditioning reaction chamber purge may be performed with various parameters that are advantageous, such as for a particular time, at particular flowrate or flowrates, and/or at a particular pressure or pressures. FIG. 5 shows a simple table of interval conditioning reaction chamber purge conditions that may be used. The showerhead and chamber gas composition is usually an inert gas but, in some embodiments, the gas could be composed of any combination of Ar, $H_2$, He, $O_2$, $N_2$, for example, and not limited to these. Flow rates typically are greater than 1 SLM but in some embodiments the flow rates may be configured to maximize the purging internal/upstream components independently. There is a wide range of conditions that can be used to tailor a solution for the specific cases where throughput optimization is required.

In some embodiments, the interval conditioning reaction chamber purge may be performed for an amount of time that results in the removal of some unwanted accumulation, which in turn is greater than the time that other gases are flowed during other pre-processing, processing, and post-processing operations. For example, in some instances, performing the interval conditioning reaction chamber purge for at least 1 minute, such as at least 1 minute and 30 seconds, 5 minutes, 10 minutes, and 30 minutes, is an amount of time that the interval conditioning reaction chamber purge can remove the desired amount of unwanted chamber accumulation. If the interval conditioning reaction chamber purge is not performed for a long enough time, then the desired amount of chamber accumulation will not be removed. The timing of these interval conditioning reaction chamber purges may generally be longer than other purge operations, such as purge operations performed during an ALD cycle that can range from between 0.5 seconds to about 1.5 seconds; these short duration flows (e.g., 120 times shorter than a interval conditioning reaction chamber purge lasting at least 1 minute) may not remove the desired amount of chamber accumulation.

In some embodiments, the interval conditioning reaction chamber purge may be performed at various flowrates and/or pressures that results in the removal of some unwanted accumulation. In some such embodiments, the flowrates of the interval conditioning reaction chamber may be at least 2.5 standard liters per minute (slm), 3 slm, 5 slm, 10 slm, 15 slm, 30 slm, 45 slm, and 60 slm, for instance; the pressures may be between about 0.05 Torr and 6 Torr, including 2 and 2.2 Torr. In some embodiments, the flowrate and/or pressure of the interval conditioning reaction chamber purge may remain constant for the entirety of the interval conditioning reaction chamber purge. In some other embodiments, the flowrate and/or pressure of the interval conditioning reaction chamber purge may vary such that it has at least two different flowrates and/or two different pressures during the interval conditioning reaction chamber purge. In some such embodiments, the various flowrates and/or pressures may be repeated or cycled, such as a first flowrate followed by a second flowrate lower than that first flowrate, followed by the first flowrate and then the second flowrate. In some such instances, the first flowrate may be a high flowrate such as at least 10 slm and the second flowrate may be less than 5 slm. The flowrates and/or pressures of the interval conditioning reaction chamber purge may, in some embodiments, be the same as the flowrates and pressures of other purge operations. In some other embodiments, the flowrates and/or pressures of the interval conditioning reaction chamber purge may be higher than the flowrates of other purge operations, such as those performed during an ALD cycle that can range from between about 1 slm to 3 slm, for example.

In some embodiments, the combined flowrates and time duration of the interval conditioning reaction chamber purge result in the interval conditioning reaction chamber purge being different than other purge operations. For instance, the flowrate of the interval conditioning reaction chamber purge may be the same as a purge performed during an ALD cycle, but the duration of the interval conditioning reaction chamber purge and the ALD cycle purge are different.

Accordingly, implementation of the mid-batch (interval) conditioning purge at operation 306 may increase the total number of wafers able to be processed within the reaction chamber between required clean cycles, thus effectively increasing the batch size of the wafers to be processed, and extending the maximum level of accumulation/wafer count that can be tolerated before the chamber must be cleaned before processing can continue. Total operational throughput of wafers processed in a given reaction chamber by extending the usability, or lifespan, of the reaction chamber between required dry clean cycles, is thereby provided.

In some embodiments, a plasma may be generated in the reaction chamber during at least some of the interval conditioning reaction chamber purge. Similar to above, wafers are not positioned in the reaction chamber during this plasma generation. The plasma may be generated by applying RF power to the reaction chamber, such as between 400 W and 5,000 W, including between 850 W and 4,500 W. Gas may be flowed during the interval conditioning reaction chamber purge while applying the RF power which may include, for instance, argon, molecular oxygen, nitrous oxide ($N_2O$), or a combination thereof, such as Argon together with molecular oxygen, or $N_2O$ with molecular oxygen. In some instances, the RF power may be applied during all of the interval conditioning reaction chamber purge, while in some other instances, the RF power may be applied during only a part of the interval conditioning reaction chamber purge. The RF power application and plasma generation in the reaction chamber may cause, in some instances, the electrical field of the plasma to advantageously attract defects and contaminants in order to remove them during the interval conditioning reaction chamber purge.

It may be advantageous to adjust the RF power application during the interval conditioning reaction chamber purge which may include ramping down, or decreasing, the applied RF power. This may include multiple decreases and adjustments. It may also be advantageous to ramp down, or decrease, the pressure of the reaction chamber together with the ramp down, or decrease, of applied RF power to the reaction chamber. While the disclosure is not limited by any particular theory of operation, it is understood that ramping down both the applied RF power and the reaction chamber pressure can be beneficial as it is understood that an initial high RF power is useful to attract the defects and unwanted material in the chamber, and ramping down the pressure assists in removing those defects from the chamber by reducing the residence of gases and species in the chamber. Ramping the RF power down as the pressure decreases also is understood to decrease the attraction of the electrical field which allows the defects and contaminants within the reaction chamber to exit and be removed from the reaction chamber. The RF power ramp down may be a step adjustment, such as from 4,500 W to 3,000 W, while the pressure reduction may be a constant reduction or a step adjustment. The reaction chamber pressure may decrease from, for instance, at least 5 Torr to at most 0.5 Torr, or from 4.5 Torr to 1 Torr.

In another instance, it has been found that maintaining a constant, high RF power while decreasing the pressure does not decrease as many defects in the reaction chamber as compared to decreasing both the applied RF power and the pressure in the reaction chamber. In some such instances, ramping both the power and pressure up may also be less beneficial because of the large electrical field attraction to the defects and a longer gases/species resident time in chamber. It may also be advantageous to adjust other parameters of the RF power during the interval conditioning reaction chamber purge, such as the time it is applied, the RF power, and gas flow during the RF power application.

Figure 3C:
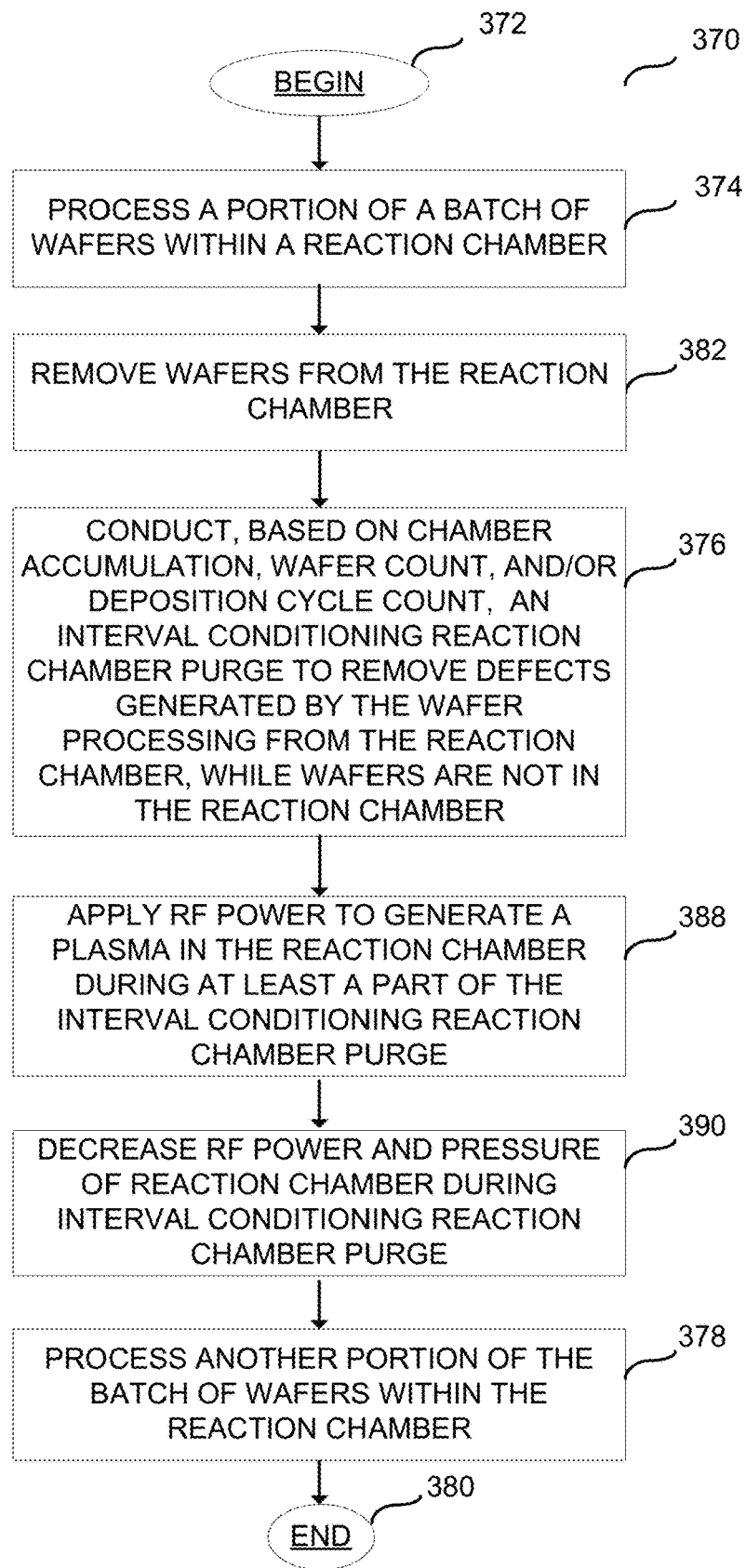
FIG. 3C shows another sample embodiment process flow for conducting an interval conditioning reaction chamber purge during processing of a batch of semiconductor wafers.

FIG. 3C shows another sample embodiment process flow 370 for conducting an interval conditioning reaction chamber purge during processing of a batch of semiconductor wafers. Process 370 includes the same operations as process 300 of FIG. 3A, including operations 302, 304, 308, and 310 which are operations 372, 374, 378, and 380, respectively, in process 370, except this process 370 also includes the modified operation 356 of FIG. 3B, now operation 376 in FIG. 3C, and operation 362 of FIG. 3B, described above, now operation 382 in FIG. 3C. Process 370 includes new operation 388 which represents the application of RF power to the reaction chamber during at least a part of the interval conditioning reaction chamber purge discussed herein in order to generate a plasma in the reaction chamber, and new optional operation 390 which includes ramping down the reaction chamber pressure and applied RF power during the interval conditioning reaction chamber purge. As noted above, the RF power may be applied during some or all of the interval conditioning reaction chamber purge. The RF power may remain constant or, in some embodiments, may be adjusted during the interval conditioning reaction chamber purge, such as ramping down as indicated by optional operation 390. Here in this optional operation 390, the RF power and the pressure are both decreased during the application of RF power during the interval conditioning reaction chamber purge. The RF power may start at a high power, such as at 4,500 W and then decrease at step adjustments to lower powers, such as stopping at a power of 800 W, for example, while the pressure is simultaneously decreased at a constant rate, such as from 4.5 Torr to 1 Torr.

As provided above, in addition to purging the reaction chamber during the interval conditioning reaction chamber purge, the interval conditioning reaction chamber purge may also purge various elements of a gas delivery system that are fluidically connected to the reaction chamber, such as to the showerhead positioned inside the reaction chamber and various flow elements fluidically connected to the showerhead, such as gas lines, flow elements, valves, elbows, and manifolds. Referring back to FIG. 2, the interval conditioning reaction chamber purge may include flowing purge gas through one or more components of the gas delivery system 220, such as the collar 210, the CT, 222, the manifold 224, the RPC module 228, and the elements fluidically connected to each of these components, such as the fluid lines 226A, 226B, 226C, 228A, and 228B. In some embodiments, the manifold 224 may have the ability to cause gas flowing through it to flow in a first flow direction to the reaction chamber 200 (e.g., through the CT 222 and the showerhead 208) and a second direction to a divert line through flow conduit 226A. The interval conditioning reaction chamber purge may include flowing purge gas into the manifold 224 and causing the manifold 224 to alternate the flow of purge gas between the first flow direction and the second flow direction in order to purge both directions and elements of the manifold 224. Similarly, the interval conditioning reaction chamber purge may include flowing the purge gas through all internal flow paths of elements fluidically connected to the reaction chamber 200, such as all internal flowpaths of RPC module 228 and the CT 222.

Figure 4:
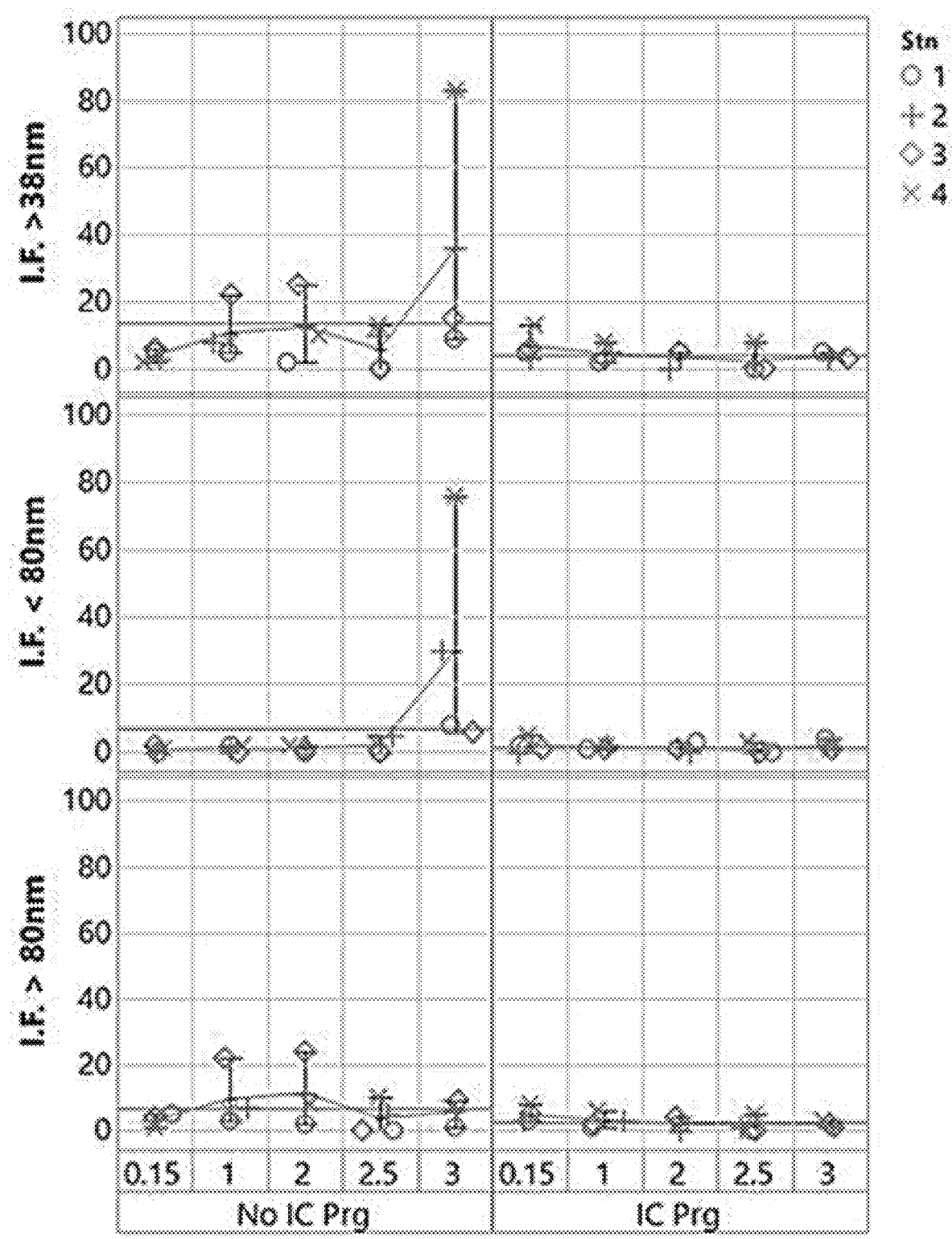
FIG. 4 is a data plot illustrating reduction in defect generation for methods and apparatus in accordance with disclosed embodiments.

FIG. 4 is a data plot illustrating reduction in defect generation for methods and apparatus in accordance with disclosed embodiments. The figure plots defect generation after total accumulation of 0.15, 1, 2, 2.5 and 3 μm of deposited material, for three different defect profiles, with and without the interval conditioning chamber purge (labeled "IC Prg" in the Figure, which may also be referred to herein as the interval conditional purge) as described herein. The top left side plot shows the total particles observed per monitor wafers at particle sizes greater than 38 nm. The middle left plot is the subset of particles per monitor wafers at particle sizes less than 80 nm. The bottom left plot is the subset of the particles per monitor wafers at particle sizes greater than 80 nm. It is shown that monitor wafers in the plots with no IC purge have overall higher performance and are OOC at greater than 2.5 um accumulation for particles less than 80 nm. Out of control events are observed at 1.0 and 2.0 um for greater than 80 nm particles in the case without interval conditioning. The right side plots show that no substantial increase in defect generation was observed when interval conditioning purge as described herein was performed in each scenario.

Figure 9A:
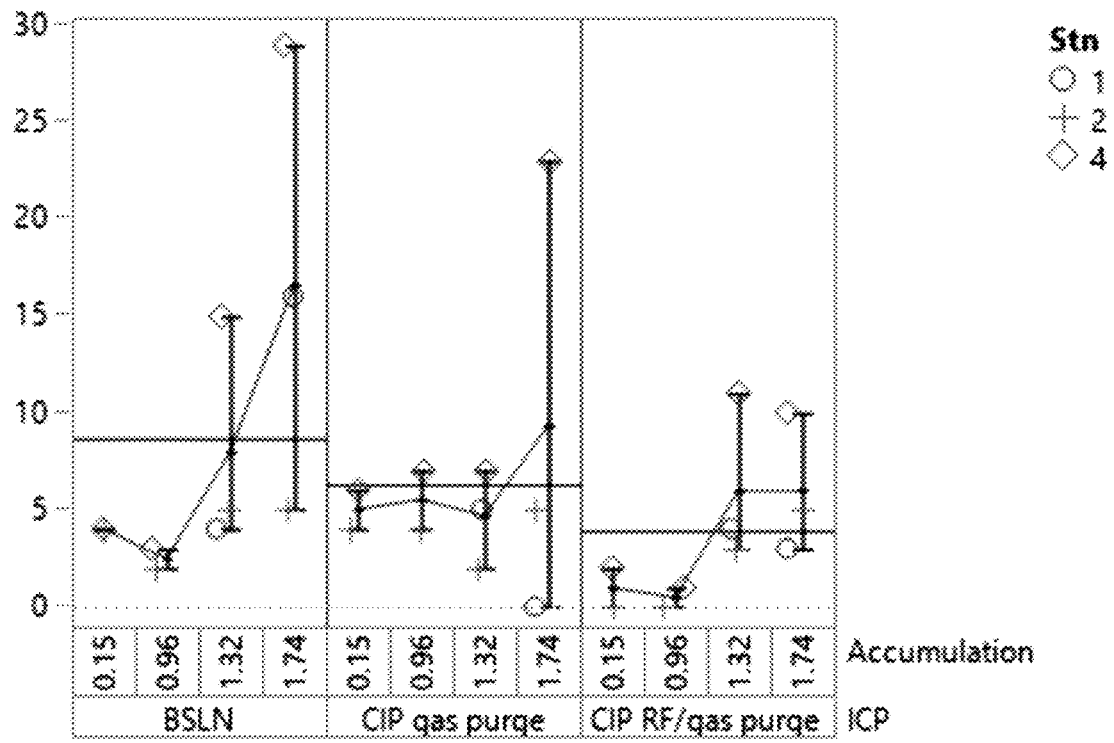
FIGS. 9A-9C are additional data plots illustrating reduction in defect generation for methods and apparatus in accordance with disclosed embodiments.
Figure 9B:
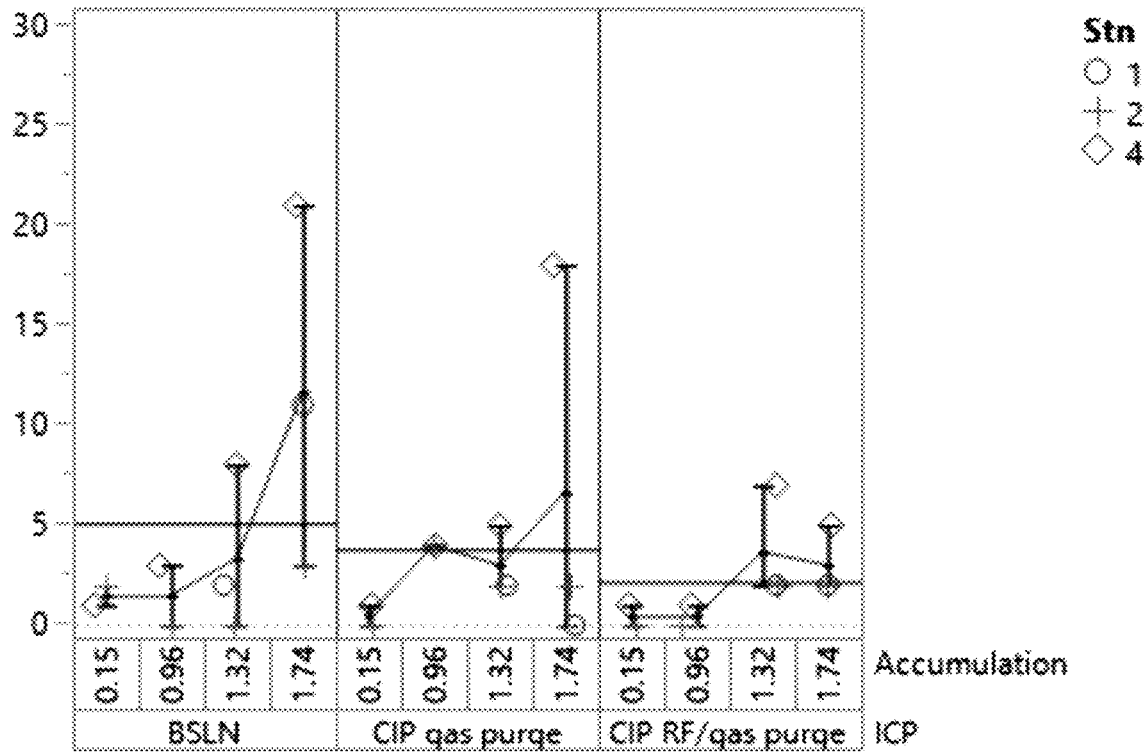
Figure 9C:
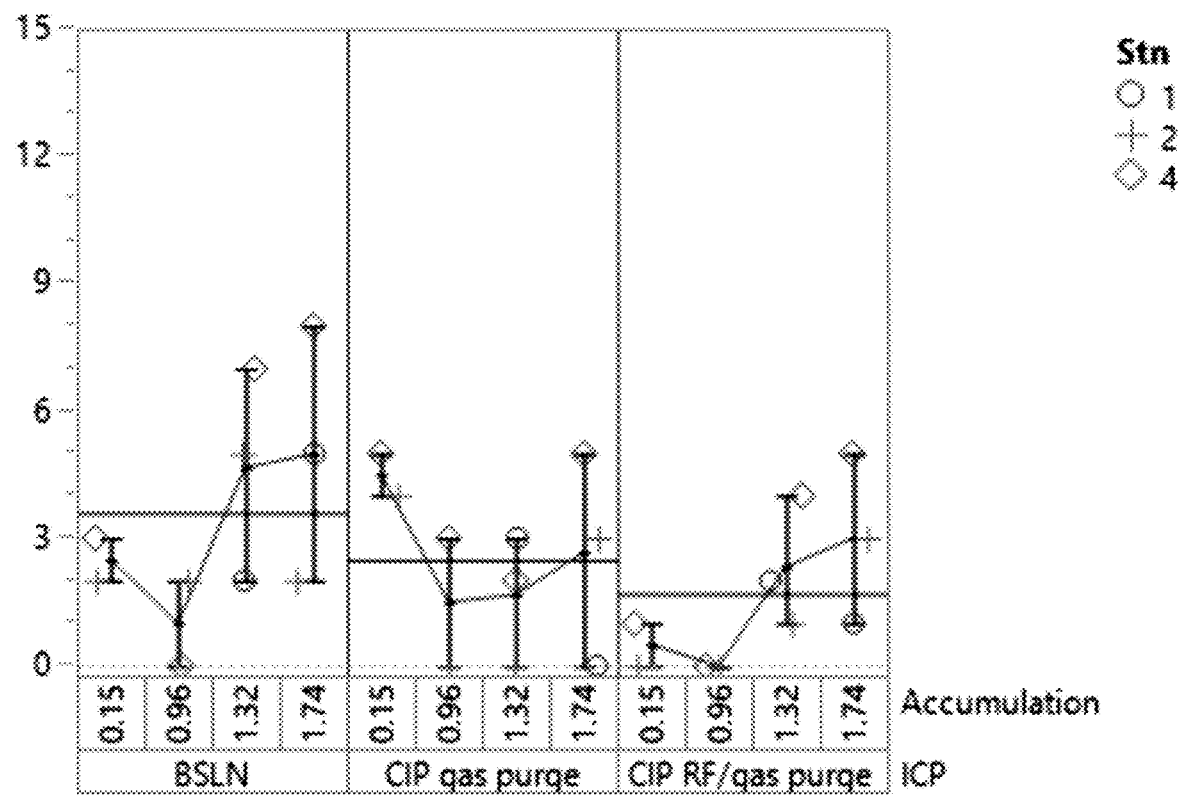

FIGS. 9A-9C are additional data plots illustrating reduction in defect generation for methods and apparatus in accordance with disclosed embodiments. The figure plots defect generation after total accumulation of 0.15, 0.96, 1.32, and 1.74 μm of deposited material, for three different defect profiles, with the first defect profile in FIG. 9A, the second defect profile in FIG. 9B, and the third defect profile in FIG. 9C. Each defect profile shows data for three interval conditioning reaction chamber purges, with the first "BSLN" showing data for an interval conditioning reaction chamber purge according to a first set of parameters (labeled "BSLN" in the Figures), with the second "CIP gas purge" showing data for an interval conditioning reaction chamber purge under a second set of parameters (labeled "CIP gas purge" in the Figures), and with the third "CIP RF/gas purge" showing data for the same interval conditioning reaction chamber purge under the second set of parameters as in FIG. 9B and with applied RF power to the reaction chamber and a decreasing RF power and pressure as described above (labeled "CIP RF/gas purge" in the Figures). The plot in FIG. 9A shows the total particles observed per monitor wafers at particle sizes greater than 38 nm, the plot in FIG. 9B shows the subset of particles per monitor wafers at particle sizes greater than 80 nm, and FIG. 9C is the subset of the particles per monitor wafers at particle sizes less than 80 nm. It is shown that the parameters of the interval conditioning reaction chamber purge affect the defects removed by the interval conditioning reaction chamber purge, as illustrated by the BSLN and CIP gas purges having different results because of the different parameters. As noted above, these parameters may be flowrates, duration of the purge, and components of the gas delivery system that may be purged. As also seen in examples of FIGS. 9A-9C, the interval conditioning chamber purge with RF power applied reduces defects as compared to the interval conditioning chamber purge without RF power applied.

In some embodiments, the interval purge can be triggered on intervals as frequently as a single deposition on a wafer. More frequently, in other embodiments, the interval purge can be triggered on intervals up to multiple depositions on multiple wafers before an OOC event, depending on the expected accumulation on the chamber surfaces based on the deposition parameters, in particular the deposition thickness/expected off-target deposition increase on the chamber surface. For example, if the expected deposition increase on the chamber surface after each wafer or group of wafers is substantially less in Process A than in Process B, relatively more wafers can be processed before interval purging is required in Process A than in Process B. But the batch size—number of wafers processed prior to chamber cleaning being required—in both processes can be increased by interval (mid-bath) conditioning purging of the reaction chamber and/or components of the gas delivery system fluidically connected to the reaction chamber.

Figure 6:
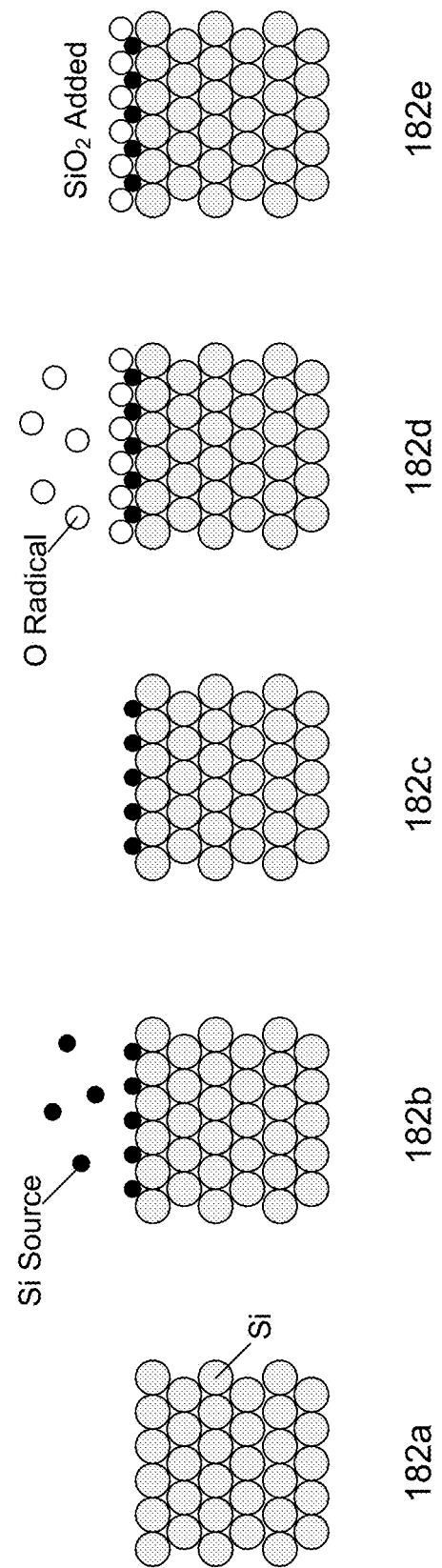
FIG. 6 is a schematic illustration of the principles of atomic layer deposition (ALD) in accordance with disclosed embodiments.

Referring to FIG. 6, a schematic illustration of a thin film is deposited on a substrate by ALD is shown. In various embodiments, a silicon-containing film is deposited, for example silicon oxide (e.g., $SiO_2$), silicon oxynitride or silicon nitride. ALD is a technique that deposits thin layers of material using sequential self-limiting reactions. ALD may be performed using any suitable technique. In various embodiments, ALD may be performed with plasma, or may be performed thermally, and may be performed in cycles.

The concept of an "ALD cycle" is relevant to the discussion of various embodiments herein. As noted above, the interval conditioning reaction chamber purge is performed differently than gas flows performed during ALD deposition. Generally an ALD cycle is the minimum set of operations used to perform a surface deposition reaction one time. The result of one cycle is production of at least a partial silicon-containing film layer on a substrate surface. Typically, an ALD cycle includes operations to deliver and adsorb at least one reactant to the substrate surface, and then react the adsorbed reactant with one or more reactants to form the partial layer of film. The cycle may include certain ancillary operations such as sweeping one of the reactants or byproducts and/or treating the partial film as deposited. Generally, a cycle contains one instance of a unique sequence of operations. As an example, an ALD cycle may include the following operations: (i) delivery/adsorption of a silicon-containing precursor, (ii) purging of silicon-containing precursor from the chamber, (iii) delivery of a second reactant (e.g., an oxidant) and a plasma, and (iv) purging of plasma from the chamber.

In accordance with this disclosure, interval conditioning (mid-batch) conditioning reaction chamber purging may be used at appropriate intervals between depositions of different wafers to increase batch sizes. According to various embodiments, the deposition/mid-bath conditioning purge cycles may be repeated throughout the batch until the maximum accumulation limit is reached.

FIG. 6 shows an example schematic illustration of an ALD cycle for depositing silicon oxide ($SiO_2$). Diagrams

182a-182e show a generic ALD cycle. In 182a, a silicon substrate is provided, which includes many silicon atoms. In 182b, a silicon-containing precursor or silicon source is introduced to the substrate, and some silicon atoms adsorb on the substrate. In 182c, un-adsorbed silicon-containing precursor or silicon source are purged from the chamber. In 182d, oxygen is introduced as oxygen radicals and the adsorbed silicon reacts with the oxygen radicals on the surface of the substrate to form a $SiO_2$ film. In 182e, the chamber is purged and the byproducts are removed, leaving behind a deposited layer of $SiO_2$.

In some embodiments, the films deposited by ALD may be highly conformal. Conformality of films may be measured by the step coverage. Step coverage may be calculated by comparing the average thickness of a deposited film on a bottom, sidewall, or top of a feature to the average thickness of a deposited film on a bottom, sidewall, or top of a feature. For example, step coverage may be calculated by dividing the average thickness of the deposited film on the sidewall by the average thickness of the deposited film at the top of the feature and multiplying it by 100 to obtain a percentage.

Unlike a chemical vapor deposition (CVD) technique, ALD processes use surface-mediated deposition reactions to deposit films on a layer-by-layer basis. In one example of an ALD process, a substrate surface, including a population of surface active sites, is exposed to a gas phase distribution of a first precursor, such as a silicon-containing precursor, in a dose provided to a process chamber housing the substrate. Molecules of this first precursor are adsorbed onto the substrate surface, including chemisorbed species and/or physisorbed molecules of the first precursor. It should be understood that when the compound is adsorbed onto the substrate surface as described herein, the adsorbed layer may include the compound as well as derivatives of the compound. For example, an adsorbed layer of a silicon-containing precursor may include the silicon-containing precursor as well as derivatives of the silicon-containing precursor. In certain embodiments, an ALD precursor dose partially saturates the substrate surface. In some embodiments, the dose phase of an ALD cycle concludes before precursor contacts the substrate to evenly saturate the surface. Typically, the precursor flow is turned off or diverted at this point, and only purge gas flows. By operating in this sub-saturation regime, the ALD process reduces the cycle time and increases throughput. However, because precursor adsorption is not saturation limited, the adsorbed precursor concentration may vary slightly across the substrate surface. Examples of ALD processes operating in the sub-saturation regime are provided in U.S. patent application Ser. No. 14/061,587, filed Oct. 23, 2013, titled "SUB-SATURATED ATOMIC LAYER DEPOSITION AND CONFORMAL FILM DEPOSITION," which is incorporated herein by reference in its entirety. After a first precursor dose, the reactor is then evacuated to remove any first precursor remaining in gas phase so that only the adsorbed species remain. A second reactant, such as an oxygen or nitrogen-containing gas, is introduced to the reactor so that some of these molecules react with the first precursor adsorbed on the surface. In some processes, the second precursor reacts immediately with the adsorbed first precursor. In other embodiments, the second precursor reacts only after a source of activation is applied temporally. The reactor may then be evacuated again to remove unbound second precursor molecules. Additional ALD cycles may be used to build film thickness.

In some implementations, the ALD methods include plasma activation, such as when the second reactant is delivered to a chamber. As described herein, the ALD method and apparatuses described herein may be conformal film deposition (CFD) methods, which are described generally in U.S. patent application Ser. No. 13/084,399 (now U.S. Pat. No. 8,728,956), filed Apr. 11, 2011, and titled "PLASMA ACTIVATED CONFORMAL FILM DEPOSITION," and in U.S. patent application Ser. No. 13/084,305, filed Apr. 11, 2011, and titled "SILICON NITRIDE FILMS AND METHODS," which are herein incorporated by reference in its entireties. Additional examples of ALD processes are described in Puurunen, "Surface chemistry of atomic layer deposition: for the trimethylaluminum/water process", 97 J. Applied Physics 12301 (2005), which is herein incorporated by reference for the purpose of providing description for suitable ALD processes.

In some embodiments, a carrier gas, such as $N_2$, Ar, Ne, He, and combinations thereof, may be continuously flowed. The carrier gas may be used as a purge gas. The inert gas may be provided to assist with pressure and/or temperature control of the process chamber, evaporation of a liquid reactant, more rapid delivery of the reactant and/or as a sweep gas for removing process gases from the process chamber and/or process chamber plumbing. These gas flows are different than the interval conditioning reaction chamber purge.

An example of adsorption and second reactant delivery operations may be performed. In an adsorption operation of an ALD cycle, the substrate may be exposed to a film precursor, such as silicon tetrachloride ($SiCl_4$) or an aminosilane, to adsorb onto the substrate surface. In some embodiments, the film precursor may be a silicon-containing precursor. In some embodiments, the film precursor, such as $SiCl_4$, may be adsorbed onto about 60% of the substrate surface. In various embodiments, when the film precursor is flowed to the chamber, the film precursor adsorbs onto active sites on the surface of the substrate, forming a thin layer of the film precursor on the surface. In various embodiments, this layer may be less than a monolayer.

After adsorption, the chamber may be optionally purged to remove excess precursor in gas phase that did not adsorb onto the surface of the substrate. Purging may involve a sweep gas, which may be a carrier gas used in other operations or a different gas. In some embodiments, purging may involve evacuating the chamber.

In a second reactant delivery operation of an ALD cycle, the substrate may be exposed to a second reactant and, optionally, a plasma. In various embodiments, the second reactant is oxygen ($O_2$) or nitrogen ($N_2$) or combinations thereof. In some embodiments where a silicon oxide layer is deposited, oxygen is used as the second reactant. In some embodiments, second reactant flow and the plasma are both turned on. In some embodiments, second reactant flow may be turned on prior to turning on the plasma to, for example, allow the second reactant flow to stabilize.

In some embodiments, the optional plasma is an in-situ plasma, such that the plasma is formed directly above the substrate surface in the chamber. In various embodiments, the plasma may be an inductively coupled plasma or a capacitively coupled plasma. An inductively coupled plasma may be set at a plasma between about 50 W and about 2000 W. In some embodiments, a bias may be applied between about 0V and about 500V. During delivery of the second reactant, the film precursor, such as $SiCl_4$, is turned off. The substrate may be exposed to the second reactant and the optional plasma for a duration that exceeds a time for plasma to interact with all precursors adsorbed on the substrate surface, forming a continuous film atop the substrate surface.

After the second reactant delivery operation, the chamber may be purged, such as by introducing a carrier or inert gas. Conditions for this operation may be any of those described above for purge processes.

In various embodiments, ALD cycles may be repeated. For example, operations for ALD may be performed for about 5 to about 70 cycles. Any suitable number of deposition cycles may be included to deposit a desired film thickness of the deposited film. In some embodiments, an ALD cycle may deposit about 1 Å per cycle. Depending on the exposure time of the operations, each cycle may deposit a film, such as a silicon oxide or silicon oxynitride film, having a thickness between about 0.05 Å and about 5 Å. In some embodiments, about two to about three cycles of ALD may be performed per minute. In some embodiments, more than about three cycles may be performed per minute, such as in chambers with inlets positioned to be closer to the substrate.

Apparatus

Figure 7:
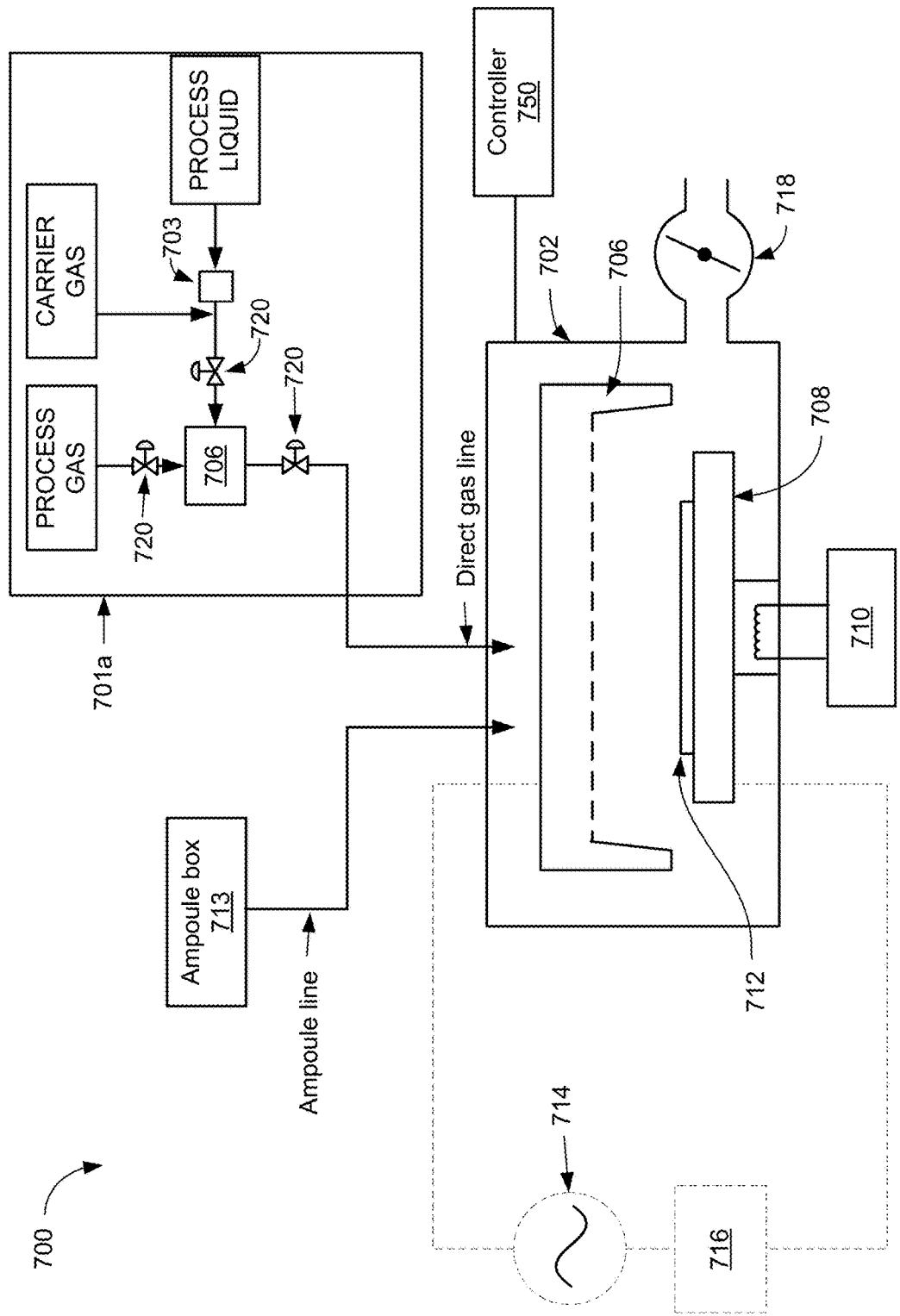
FIG. 7 is a schematic diagram of an example process tool for performing certain disclosed embodiments.

FIG. 7 depicts a schematic illustration of an embodiment of an atomic layer deposition (ALD) process station 700 having a process chamber 702, such as is available from Lam Research Corporation, for example the Striker ALD tool. The process station 700 may be used for performing certain disclosed embodiments. For example, while process station 700 may typically be used to deposit films by atomic layer deposition (ALD) on a substrate, process station 700 may be used in certain configurations to, for example, conduct atomic layer etching (ALE) or atomic layer cleaning (ALC) to etch or to clean, respectively, carbon-containing material in a patterning scheme. In some embodiments, process station 700 may be used for ALE, ALC and ALD, or in some embodiments, several process stations in a multi-station tool may include a station for ALE or ALC and a station for ALD such that substrates may be transferred between an ALC station and ALD station without breaking vacuum.

Figure 8:
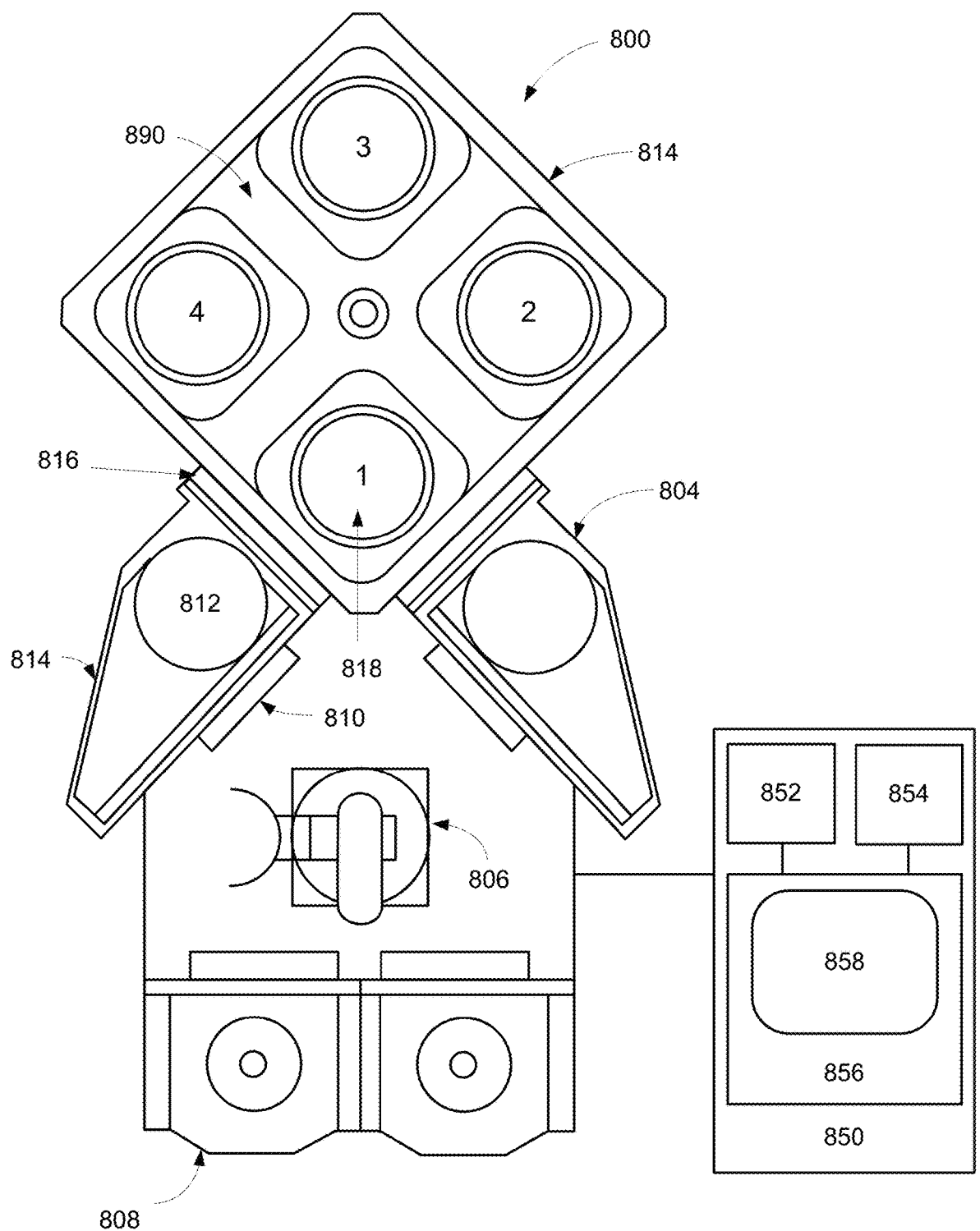
FIG. 8 is a schematic diagram of another example process tool for performing certain disclosed embodiments.

Process chamber 702 may be used for maintaining a low-pressure environment. A plurality of process stations may be included in a common low pressure process tool environment. For example, FIG. 8 depicts an embodiment of a multi-station processing tool 800. In some embodiments, one or more hardware parameters of process station 700, including those discussed in detail below, and/or process implemented by the process chamber 702, may be adjusted programmatically by one or more computer controllers 750.

Process station 700 fluidly communicates with reactant delivery system 701*a* for delivering process gases to a distribution showerhead 706. Reactant delivery system 701*a* includes a mixing vessel 704 for blending and/or conditioning process gases, such as an oxygen-containing gas, or inert gas, for delivery to showerhead 706. One or more mixing vessel inlet valves 720 may control introduction of process gases to mixing vessel 704.

As an example, the embodiment of FIG. 7 includes a vaporization point 703 for vaporizing liquid reactant to be supplied to the mixing vessel 704. In some embodiments, deposition chemistry may be provided as a vaporized liquid reactant. Deposition chemistry may be used following performing ALE or ALC in process chamber 702 to form a patterned carbon-containing material such that a conformal film may be deposited by ALD over the patterned carbon-containing material. In some embodiments, vaporization point 703 may be a heated vaporizer. The saturated reactant vapor produced from such vaporizers may condense in downstream delivery piping. Exposure of incompatible gases to the condensed reactant may create small particles. These small particles may clog piping, impede valve operation, contaminate substrates, etc. Some approaches to addressing these issues involve purging and/or evacuating the delivery piping to remove residual reactant. However, purging the delivery piping may increase process station cycle time, degrading process station throughput. Thus, in some embodiments, delivery piping downstream of vaporization point 703 may be heat traced. In some examples, mixing vessel 704 may also be heat traced. In one non-limiting example, piping downstream of vaporization point 703 has an increasing temperature profile extending from approximately 100° C. to approximately 150° C. at mixing vessel 704.

In some embodiments, a liquid precursor or liquid reactant may be vaporized at a liquid injector (not shown in FIG. 7). For example, a liquid injector may inject pulses of a liquid reactant into a carrier gas stream upstream of the mixing vessel 704. In one embodiment, a liquid injector may vaporize the reactant by flashing the liquid from a higher pressure to a lower pressure. In another example, a liquid injector may atomize the liquid into dispersed micro-droplets that are subsequently vaporized in a heated delivery pipe. Smaller droplets may vaporize faster than larger droplets, reducing a delay between liquid injection and complete vaporization. Faster vaporization may reduce a length of piping downstream from vaporization point 703. In one scenario, a liquid injector may be mounted directly to mixing vessel 704. In another scenario, a liquid injector may be mounted directly to showerhead 706.

In some embodiments, a liquid flow controller (LFC) upstream of vaporization point 703 may be provided for controlling a mass flow of liquid for vaporization and delivery to process chamber 702. For example, the LFC may include a thermal mass flow meter (MFM) located downstream of the LFC. A plunger valve of the LFC may then be adjusted responsive to feedback control signals provided by a proportional-integral-derivative (PID) controller in electrical communication with the MFM. However, it may take one second or more to stabilize liquid flow using feedback control. This may extend a time for dosing a liquid reactant. Thus, in some embodiments, the LFC may be dynamically switched between a feedback control mode and a direct control mode. In some embodiments, this may be performed by disabling a sense tube of the LFC and the PID controller.

Showerhead 706 distributes process gases toward substrate 712. In the embodiment shown in FIG. 7, the substrate 712 is located beneath showerhead 706 and is shown resting on a chuck or pedestal 708. The showerhead 706 may be positioned at a distance of between 750 mils (0.35 in.) to 700 mils (0.7 in.) to attain a desirable level of directionality of ions provided, or dispersed, by showerhead 706 toward substrate 712. In some embodiments, a lower, or lesser, gap between showerhead 706 and pedestal 712 may be employed to retain directionality of ions dispersed from showerhead 706. However, at low pressure conditions (e.g. below 10 mT, or 0.01 Torr) a higher, or larger, gap may be needed to achieve stable dispersion of ionized plasma from showerhead 706. In some embodiments, a chamber may include multiple chucks or pedestals. Showerhead 706 may have any suitable shape, and may have any suitable number and arrangement of ports for distributing process gases to substrate 712.

In some embodiments, pedestal 808 may be raised or lowered to expose substrate 712 to a volume between the substrate 712 and the showerhead 706. In some embodiments, pedestal 708 may be temperature controlled via heater 710. Pedestal 708 may be set to any suitable temperature, such as between about 25° C. and about 650° C. or between about 35° C. and about 100° C. during operations for performing various disclosed embodiments. It will be appreciated that, in some embodiments, pedestal height may be adjusted programmatically by a suitable computer controller 750.

In another scenario, adjusting a height of pedestal 708 may allow a plasma density to be varied during plasma activation performed in certain disclosed embodiments. For example, plasma may be ignited when an inert gas is flowed to the substrate 712 via showerhead 706 to remove modified core material after the core material is exposed to an oxygen-containing gas. At the conclusion of a process phase, pedestal 708 may be lowered during another substrate transfer phase to allow removal of substrate 712 from pedestal 708.

In some embodiments, a position of showerhead 706 may be adjusted relative to pedestal 708 to vary a volume between the substrate 712 and the showerhead 706. Further, it will be appreciated that a vertical position of pedestal 708 and/or showerhead 706 may be varied by any suitable mechanism within the scope of the present disclosure. In some embodiments, pedestal 708 may include a rotational axis for rotating an orientation of substrate 712. It will be appreciated that, in some embodiments, one or more of these example adjustments may be performed programmatically by one or more suitable computer controllers 750.

In various embodiments, the controller 750 may be programmed to implement interval conditioning (mid-batch) purge in conjunction with deposition operations, including to monitoring processing, including particle measurement on monitor wafers, and executing instructions for purging after a set number of wafers or after a fixed accumulation limit. The controller 750 may include one or more memory devices, one or more mass storage devices, and one or more processors. The processor may include a CPU or computer, analog, and/or digital input/output connections, stepper motor controller boards, etc. The computer controller 750 may include any of the features described below with respect to controller 750 of FIG. 7 or controller 850 of FIG. 8.

In some embodiments where plasma may be used as discussed above, showerhead 706 and pedestal 708 electrically communicate with a radio frequency (RF) power supply 714 and matching network 716 for powering a plasma. In some embodiments, the plasma energy may be controlled by controlling one or more of a process station pressure, a gas concentration, an RF source power, an RF source frequency, and a plasma power pulse timing. For example, RF power supply 714 and matching network 716 may be operated at any suitable power to form a plasma having a desired composition of radical species. Likewise, RF power supply 714 may provide RF power of any suitable frequency. In some embodiments, RF power supply 714 may be configured to control high- and low-frequency RF power sources independently of one another. Example low-frequency RF frequencies may include, but are not limited to, frequencies between 0 kHz and 500 kHz. Example high-frequency RF frequencies may include, but are not limited to, frequencies between 1.8 MHz and 2.45 GHz, or greater than about 13.56 MHz, or greater than 27 MHz, or greater than 40 MHz, or greater than 60 MHz. It will be appreciated that any suitable parameters may be modulated discretely or continuously to provide plasma energy for the surface reactions.

In some embodiments, the plasma may be monitored in-situ by one or more plasma monitors. In one scenario, plasma power may be monitored by one or more voltage, current sensors (e.g., VI probes). In another scenario, plasma density and/or process gas concentration may be measured by one or more optical emission spectroscopy sensors (OES). In some embodiments, one or more plasma parameters may be programmatically adjusted based on measurements from such in-situ plasma monitors. For example, an OES sensor may be used in a feedback loop for providing programmatic control of plasma power. In some embodiments, an OES sensor may be used to set an endpoint to stop etching after a certain amount of time using certain disclosed embodiments. It will be appreciated that, in some embodiments, other monitors may be used to monitor the plasma and other process characteristics. Such monitors may include, but are not limited to, infrared (IR) monitors, acoustic monitors, and pressure transducers.

In some embodiments, instructions for a controller 750 may be provided via input/output control (IOC) sequencing instructions. In one example, the instructions for setting conditions for a process phase may be included in a corresponding recipe phase of a process recipe. In some cases, process recipe phases may be sequentially arranged, so that all instructions for a process phase are executed concurrently with that process phase. In some embodiments, instructions for setting one or more reactor parameters may be included in a recipe phase. For example, a first recipe phase may include instructions for setting a flow rate of an inert and/or a reactant gas (e.g., oxygen-containing gas), instructions for setting a flow rate of a carrier gas (such as argon), and time delay instructions for the first recipe phase. A second, subsequent recipe phase may include instructions for modulating or stopping a flow rate of an inert and/or a reactant gas, and instructions for modulating a flow rate of a carrier or purge gas and time delay instructions for the second recipe phase. A third recipe phase may include instructions for modulating a flow rate of a second gas such as argon, instructions for modulating the flow rate of a carrier or purge gas, instructions for igniting a plasma at low plasma power between about 250 W and about 750 W for a four-station processing tool, and time delay instructions for the third recipe phase. A fourth, subsequent recipe phase may include instructions for modulating or stopping a flow rate of an inert and/or a reactant gas, and instructions for modulating a flow rate of a carrier or purge gas and time delay instructions for the third recipe phase. Such recipes may be used to etch carbon-containing material such as core material on a substrate to yield vertical sidewalls that meet the surface of an underlying layer to be etched at a point at about 90°±5°. Additional recipes may also follow and may be used to deposit a conformal film over the patterned core material by ALD. For example, for depositing a silicon oxide conformal film over a patterned core material, one additional recipe phases may include instructions for setting a flow rate of a silicon-containing precursor, and another additional recipe phase may include instructions for setting a flow rate of an oxygen-containing reactant and time delay instructions for the additional recipe phase. It will be appreciated that these recipe phases may be further subdivided and/or iterated in any suitable way within the scope of the present disclosure.

Further, in some embodiments, pressure control for process station 700 may be provided by butterfly valve 718. As shown in the embodiment of FIG. 7, butterfly valve 718 throttles a vacuum provided by a downstream vacuum pump (not shown in FIG. 7). However, in some embodiments, pressure control of process station 700 may also be adjusted by varying a flow rate of one or more gases introduced to the process station 700.

As described above, one or more process stations may be included in a multi-station processing tool. FIG. 8 shows a schematic view of an embodiment of a multi-station processing tool 800 with an inbound load lock 802 and an outbound load lock 804, either or both of which may include a remote plasma source (not shown in FIG. 8). A robot 806, at atmospheric pressure, is configured to move wafers from a cassette loaded through a pod 808 into inbound load lock 802 via an atmospheric port 810. A wafer (not shown in FIG. 8) is placed by the robot 806 on a pedestal 812 in the inbound load lock 802, the atmospheric port 810 is closed, and the load lock inbound 802 is pumped down. Where the inbound load lock 802 includes a remote plasma source, the wafer may be exposed to a remote plasma treatment in the inbound load lock 802 prior to being introduced into a processing chamber 814. Further, the wafer also may be heated in the inbound load lock 802 as well, for example, to remove moisture and adsorbed gases. Next, a chamber transport port 816 to processing chamber 814 is opened, and another robot (not shown) places the wafer into the reactor on a pedestal of a first station shown in the reactor for processing. While the embodiment depicted in FIG. 8 includes load locks, it will be appreciated that, in some embodiments, direct entry of a wafer into a process station may be provided.

The depicted processing chamber 814 includes four process stations, numbered from 1 to 4 in the embodiment shown in FIG. 8. Each station has a heated pedestal (shown at 818 for station 1), and gas line inlets. It will be appreciated that in some embodiments, each process station may have different or multiple purposes. For example, in some embodiments, a process station may be switchable between an ALC, an ALD and plasma-enhanced ALD process mode. In some embodiments, exposure to a deposition precursor and exposure to a second reactant and plasma are performed in the same station. Additionally or alternatively, in some embodiments, processing chamber 814 may include one or more matched pairs of ALD and plasma-enhanced ALD process stations. While the depicted processing chamber 814 includes four stations, it will be understood that a processing chamber according to the present disclosure may have any suitable number of stations. For example, in some embodiments, a processing chamber may have five or more stations, while in other embodiments a processing chamber may have three or fewer stations.

FIG. 8 depicts an embodiment of a wafer handling system 890 for transferring wafers within processing chamber 814. In some embodiments, wafer handling system 890 may transfer wafers between various process stations and/or between a process station and a load lock. It will be appreciated that any suitable wafer handling system may be employed. Non-limiting examples include wafer carousels and wafer handling robots. FIG. 8 also depicts an embodiment of a system controller 850 employed to control process conditions and hardware states of process tool 800. System controller 850 may include one or more memory devices 856, one or more mass storage devices 854, and one or more processors 852. Processor 852 may include a CPU or computer, analog, and/or digital input/output connections, stepper motor controller boards, etc.

In some embodiments, system controller 850 controls all of the activities of process tool 800. System controller 850 executes system control software 858 stored in mass storage device 854, loaded into memory device 856, and executed on processor 852. Alternatively, the control logic may be hard coded in the controller 850. Applications Specific Integrated Circuits, Programmable Logic Devices (e.g., field-programmable gate arrays, or FPGAs) and the like may be used for these purposes. In the following discussion, wherever "software" or "code" is used, functionally comparable hard coded logic may be used in its place. System control software 858 may include instructions for controlling the timing, mixture of gases, gas flow rates, chamber and/or station pressure, chamber and/or station temperature, wafer temperature, target power levels, RF power levels, substrate pedestal, chuck and/or susceptor position, and other parameters of a particular process performed by process tool 800. System control software 858 may be configured in any suitable way. For example, various process tool component subroutines or control objects may be written to control operation of the process tool components used to carry out various process tool processes. System control software 858 may be coded in any suitable computer readable programming language.

In some embodiments, system control software 858 may include input/output control (IOC) sequencing instructions for controlling the various parameters described above. Other computer software and/or programs stored on mass storage device 854 and/or memory device 856 associated with system controller 850 may be employed in some embodiments. Examples of programs or sections of programs for this purpose include a substrate positioning program, a process gas control program, a pressure control program, a heater control program, and a plasma control program.

A substrate positioning program may include program code for process tool components that are used to load the substrate onto pedestal 818 and to control the spacing between the substrate and other parts of process tool 800.

A process gas control program may include code for controlling gas composition (e.g., silicon-containing gases, oxygen-containing gases, and purge gases as described herein) and flow rates and optionally for flowing gas into one or more process stations prior to deposition in order to stabilize the pressure in the process station. A pressure control program may include code for controlling the pressure in the process station by regulating, for example, a throttle valve in the exhaust system of the process station, a gas flow into the process station, etc.

A heater control program may include code for controlling the current to a heating unit that is used to heat the substrate. Alternatively, the heater control program may control delivery of a heat transfer gas (such as helium) to the substrate.

A plasma control program may include code for setting RF power levels applied to the process electrodes in one or more process stations in accordance with the embodiments herein.

A pressure control program may include code for maintaining the pressure in the reaction chamber in accordance with the embodiments herein.

In some embodiments, there may be a user interface associated with system controller 850. The user interface may include a display screen, graphical software displays of the apparatus and/or process conditions, and user input devices such as pointing devices, keyboards, touch screens, microphones, etc.

In some embodiments, parameters adjusted by system controller 850 may relate to process conditions. Non-limiting examples include process gas composition and flow rates, temperature, pressure, plasma conditions (such as RF bias power levels), etc. These parameters may be provided to the user in the form of a recipe, which may be entered utilizing the user interface.

Signals for monitoring the process may be provided by analog and/or digital input connections of system controller 850 from various process tool sensors. The signals for controlling the process may be output on the analog and digital output connections of process tool 800. Non-limiting examples of process tool sensors that may be monitored include mass flow controllers, pressure sensors (such as manometers), thermocouples, etc. Appropriately programmed feedback and control algorithms may be used with data from these sensors to maintain process conditions.

System controller 850 may provide program instructions for implementing the above-described deposition processes. The program instructions may control a variety of process parameters, such as DC power level, RF bias power level, pressure, temperature, etc. The instructions may control the parameters to operate in-situ deposition of film stacks according to various embodiments described herein.

The system controller 850 will typically include one or more memory devices and one or more processors configured to execute the instructions so that the apparatus will perform a method in accordance with disclosed embodiments. Machine-readable media containing instructions for controlling process operations in accordance with disclosed embodiments may be coupled to the system controller 850.

In some implementations, the system controller 850 is part of a system, which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The system controller 850, depending on the processing conditions and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the system controller 850 refers to electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the system controller 850 in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The system controller 850, in some implementations, may be a part of or coupled to a computer that is integrated with, coupled to the system, otherwise networked to the system, or a combination thereof. For example, the system controller 850 may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the system controller 850 receives instructions in the form of data, which specify parameters for each of the processing steps to be performed during one or more operations. It should be understood that the parameters may be specific to the type of process to be performed and the type of tool that the system controller 850 is configured to interface with or control. Thus as described above, the system controller 850 may be distributed, such as by including one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

The controller described herein may have program instructions for executing any and all of the example processes and techniques described herein. For example, the apparatuses may have instructions for conducting a deposition on a first portion of a batch of deposition wafers in a reaction chamber, conducting the interval conditioning reaction chamber purge as described herein, and after the interval conditioning reaction chamber purge, conducting the deposition on another portion of the batch of deposition wafers in the reaction chamber. This may also include instructions for performing all of the operations of the processes described above in FIGS. 3A and 3B.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an ALD chamber or module, an atomic layer clean (ALC) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the system controller 850 might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

An appropriate apparatus for performing the methods disclosed herein is further discussed and described in U.S. patent application Ser. No. 13/084,399 (now U.S. Pat. No. 8,728,956), filed Apr. 11, 2011, and titled "PLASMA ACTIVATED CONFORMAL FILM DEPOSITION"; and Ser. No. 13/084,305, filed Apr. 11, 2011, and titled "SILICON NITRIDE FILMS AND METHODS," each of which is incorporated herein in its entireties.

The apparatus/process described herein may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility. Lithographic patterning of a film typically includes some or all of the following operations, each operation enabled with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

Conclusion

Although the foregoing embodiments have been described in some detail for purposes of clarity of understanding, it will be apparent that certain changes and modifications may be practiced within the scope of the appended claims. It should be noted that there are many alternative ways of implementing the processes, systems, and apparatus of the present embodiments. Accordingly, the present embodiments are to be considered as illustrative and not restrictive, and the embodiments are not to be limited to the details given herein.

The following sample claims are provided for further illustration of certain embodiments of the disclosure. The disclosure is not necessarily limited to these embodiments.

What is claimed is:

1. A method of processing deposition wafers in a processing apparatus, the method comprising:
   conducting a deposition on a first portion of a batch of deposition wafers in a reaction chamber;
   conducting an interval conditioning reaction chamber purge to remove defects generated by the wafer processing from the reaction chamber before an accumulation baseline is reached; and
   following the interval conditioning reaction chamber purge, conducting the deposition on another portion of the batch of deposition wafers in the reaction chamber, wherein the conducting the interval conditioning reaction chamber purge is performed based on a total accumulation of deposited material during the first portion of the batch or based on a count of wafers processed in the reaction chamber in the first portion of the batch of wafers.

2. The method of claim 1, further comprising removing, after conducting the deposition on the first portion of the batch of deposition wafers in the reaction chamber, the wafers from the reaction chamber, wherein no wafers are inside the reaction chamber during the interval conditioning reaction chamber purge.

3. The method of claim 1, wherein:
   the conducting the interval conditioning reaction chamber purge is performed when the total accumulation of deposited material in the reaction chamber has reached an accumulation threshold, and
   the accumulation threshold is less than the accumulation baseline.

4. The method of claim 3, further comprising determining whether the total accumulation of deposited material in the reaction chamber has reached the accumulation threshold, wherein the conducting the interval conditioning reaction chamber purge is performed in response to determining that the total accumulation of deposited material in the reaction chamber has reached the accumulation threshold.

5. The method of claim 1, wherein the total accumulation of deposited material in the reaction chamber is based on a count of wafers processed in the first portion of the batch.

6. The method of claim 1, wherein:
   the first portion of the batch of wafers includes a number of wafers,
   the conducting the interval conditioning reaction chamber purge is performed when the count of the wafers processed during the first portion of the batch of wafers has reached the number of wafers,
   the accumulation baseline is reached when a second count of wafers have been processed in the reaction chamber, and
   the count is less than the second count.

7. The method of claim 6, further comprising determining whether the count of wafers processed during the first portion of the batch of wafers has reached the number of wafers, wherein the conducting the interval conditioning reaction chamber purge is performed in response to determining that the count of wafers processed during the first portion of the batch of wafers has reached the number of wafers.

8. The method of claim 1, further comprising:
   conducting, after conducting the deposition of the other portion of the batch of deposition wafers, a second interval conditioning reaction chamber purge to remove defects generated by the wafer processing from the reaction chamber before the accumulation baseline is reached; and
   following the second interval conditioning reaction chamber purge, conducting the deposition on a third portion of the batch of deposition wafers in the reaction chamber.

9. The method of claim 1, wherein the accumulation baseline is based on a count of wafers in the first portion of the batch.

10. The method of claim 1, wherein the accumulation baseline is based on a total accumulation of deposited material during the first portion of the batch.

11. The method of claim 1, further comprising cleaning the interior surfaces of the reaction chamber following the accumulation baseline being reached.

12. The method of claim 1, wherein the conducting the interval conditioning reaction chamber purge includes flowing purge gas through one or more components of a gas delivery system fluidically connected to the reaction chamber.

13. The method of claim 12, wherein the components of the gas delivery system include one or more of a showerhead, a collar, gas line, a valves, a manifold, a ceramic tee, and/or a remote plasma control module.

14. The method of claim 1, wherein the conducting the interval conditioning reaction chamber purge includes flowing purge gas into the reaction chamber at two or more flowrates.

15. The method of claim 1, wherein the conducting the interval conditioning reaction chamber purge includes flowing purge gas into the reaction chamber at a constant flowrate.

16. The method of claim 1, wherein the conducting the interval conditioning reaction chamber purge includes flowing purge gas into the reaction chamber for at least 1 minute.

17. The method of claim 1, further comprising, applying, during at least a part of the interval conditioning reaction chamber purge, an RF power to the reaction chamber to generate a plasma within the reaction chamber.

18. The method of claim 17, wherein a power of the applied RF is reduced during the application of the RF power to the reaction chamber.

19. The method of claim 18, wherein a pressure of the reaction chamber is reduced during the application of the RF power to the reaction chamber.

* * * * *